United States Patent
Rajula et al.

(10) Patent No.: US 8,638,092 B2
(45) Date of Patent: Jan. 28, 2014

(54) CURRENT SENSOR

(75) Inventors: Gangi Reddy Rajula, Andhrapradesh (IN); Sarinkumar Anakkat Koyilothu, Karnataka (IN); Sankaranarayanan Kalathil, Karnataka (IN)

(73) Assignee: Honeywell International, Inc., Morristown, NJ (US)

( * ) Notice: Subject to any disclaimer, the term of this patent is extended or adjusted under 35 U.S.C. 154(b) by 352 days.

(21) Appl. No.: 12/852,228

(22) Filed: Aug. 6, 2010

(65) Prior Publication Data

US 2012/0032674 A1 Feb. 9, 2012

(51) Int. Cl.
*G01V 3/00* (2006.01)

(52) U.S. Cl.
USPC .................. 324/253; 324/117 H; 324/117 R

(58) Field of Classification Search
USPC ........................................ 324/253
See application file for complete search history.

(56) References Cited

U.S. PATENT DOCUMENTS

| | | | |
|---|---|---|---|
| 6,759,840 B2* | 7/2004 | Marasch et al. | 324/117 H |
| 7,259,545 B2 | 8/2007 | Stauth et al. | |
| 7,622,909 B2 | 11/2009 | Teppan | |
| 7,969,140 B2* | 6/2011 | Teppan | 324/127 |
| 2009/0295384 A1 | 12/2009 | Teppan | |

OTHER PUBLICATIONS

"Magnetic Current Sensing", downloaded from http://www.ssec.honeywell.com/magnetic/datasheets/an209.pdf, Apr. 2000, 7 pages.
"Cross Axis Effect for AMR Magnetic Sensors", downloaded from http://www.magneticsensors.com/datasheets/an215.pdf, Nov. 2003, 4 pages.
Application Note Non Intrusive Current Sensing with MLX91205, downloaded from http://www.melexis.com/Assets/Non_intrusive_current_sensing_with_MLX91205_5530.aspx, Dec. 2008, 16 pages.

* cited by examiner

*Primary Examiner* — Arleen M Vazquez
*Assistant Examiner* — Alesa Allgood
(74) *Attorney, Agent, or Firm* — Craige Thompson; Thompson Patent Law Offices

(57) ABSTRACT

This disclosure is directed to current sensing techniques for use within a magnetic current sensor. According to one aspect of the disclosure, a current sensing device includes a magnetic core, and a magnetic field sensor positioned substantially within a cavity formed by an air gap interface of the magnetic core and configured to sense a magnetic field induced by an electrical current that is conducted through a conductor passing through a central opening of the magnetic core.

18 Claims, 14 Drawing Sheets

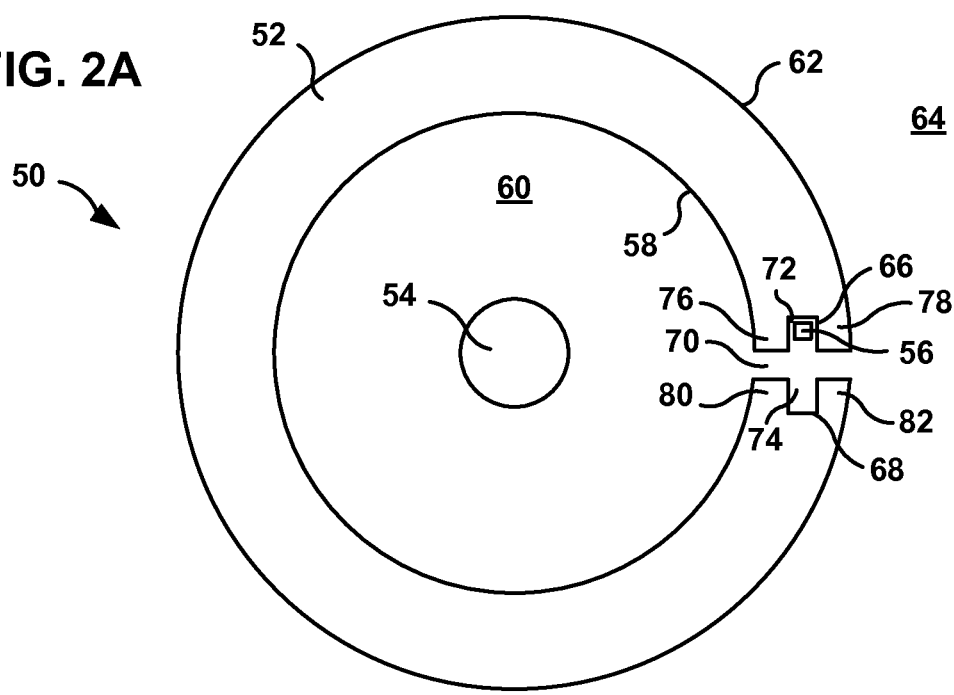
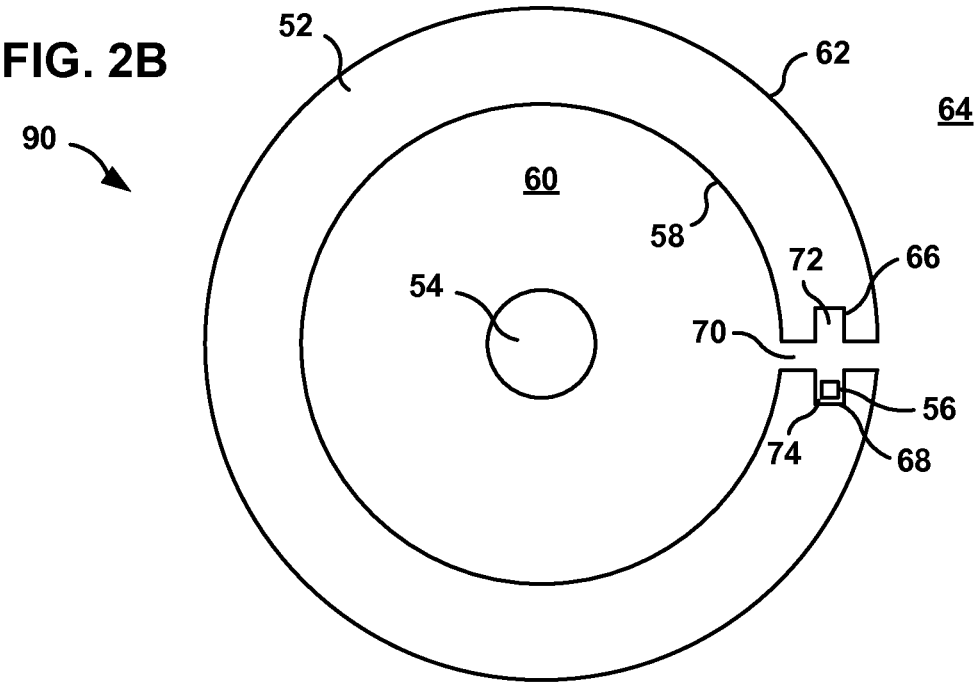

CURRENT SENSOR

TECHNICAL FIELD

The disclosure relates to magnetic sensors, and more particularly to magnetic current sensors.

BACKGROUND

In various industrial or commercial applications, an amount of current flowing through an electrical conductor may be measured using a current measuring device. One known current measuring device uses a core of magnetic material having an opening through which an electrical conductor passes, where the core of magnetic material is generally shaped as a toroid and defines a "slot-shaped" air gap, in which a Hall effect sensor is positioned. The slot-shaped air gap of the known current measuring device has a rectangular cross-sectional shape, and a three-dimensional shape of a box (e.g., a right rectangular prism). The current through the conductor contributes to a magnetic field within the toroid-shaped core of magnetic material. Magnetic flux lines through the core pass through the slot-shaped air gap, and are sensed by the Hall effect sensor that is positioned within the slot-shaped air gap. Flux density across the slot-shaped air gap may be proportional to the amount of current flowing through the conductor, and a determination of the current may be based on the flux density measured by the Hall effect sensor.

FIG. 1A is a conceptual diagram of such a prior art current sensor 10. A current-to-be-measured flows through a conductor 12. Conductor 12 passes through an opening 14 defined by a magnetic core 16 of magnetic material. Magnetic core 16 defines a slot-shaped air gap 18, in which a Hall effect sensor 20 is positioned to measure flux density of the magnetic field induced by the current flowing through the conductor 12. A determination of the current flowing through conductor 12 may be obtained based on the measured flux density.

As shown in FIG. 1A, slot-shaped air gap 18 is bounded from above and below, respectively, by a first face 22 of magnetic core 16 and by a second face 24 of magnetic core 16. Slot-shaped air gap 18 has a rectangular cross-sectional shape, and Hall effect sensor 20 is positioned approximately in the middle of slot-shaped air gap 18, roughly an equal distance from first face 22 as from second face 24. In three dimensions, slot-shaped air gap 18 generally has a "slot" or "box" shape. Slot-shaped air gap 18 is completely bounded on its top and bottom sides, respectively, by first face 22 and second face 24 of magnetic core 16.

FIG. 1B is a conceptual diagram of the slot-shaped air gap 18 defined by the magnetic core 16 of FIG. 1, showing magnetic flux lines 26 through the slot-shaped air gap 18. In general, the magnetic flux lines 26 flow around (not shown in FIG. 1B) the magnetic core 16, and as shown in FIG. 1B, flow across slot-shaped air gap 18 in a generally uniform manner between first face 22 and second face 24 of magnetic core 16. Because the separation between first face 22 and second face 24 is generally uniform across the slot-shaped air gap 18, reluctance (that is, resistance to flux flow) is generally uniform across the slot-shaped air gap, resulting in the generally uniform flux pattern across the air gap 18, as shown. For simplicity, Hall effect sensor 20 is not shown in FIG. 1B.

SUMMARY

This disclosure is directed to current sensing techniques for use within a magnetic current sensor. An air gap interface for a magnetic core may be configured to reduce the magnetic flux density incident upon a magnetic field sensor positioned within certain regions of the air gap while shielding the magnetic field sensor from excessive levels of noise caused by external magnetic fields. Reducing the magnetic flux density incident upon the magnetic field sensor allows for the use of a high sensitivity magnetic field sensor within an open loop current sensor configuration. Shielding the magnetic field sensor from excessive levels of external magnetic fields ensures that the operation of the magnetic field sensor will not be impaired when the current sensor operates within a noisy environment (i.e., an environment subject to external magnetic fields). In this manner, the techniques in this disclosure allow a high sensitivity magnetic field sensor (e.g., a magnetoresistive sensor) to be used within an open loop current sensor even when the current sensor is subject to interference from external magnetic fields.

According to one aspect of the disclosure, a current sensing device includes a magnetic core, and a magnetic field sensor positioned substantially within a cavity formed by an air gap interface of the magnetic core and configured to sense a magnetic field induced by an electrical current that is conducted through a conductor passing through a central opening of the magnetic core.

According to another aspect of the disclosure, a method includes sensing a magnetic field induced by an electrical current that is conducted through a conductor passing through a central opening of a magnetic core with a magnetic field sensor positioned substantially within a cavity formed by an air gap interface of the magnetic core.

According to another aspect of the disclosure, a current sensing device includes a magnetic core comprising at least two air gap interfaces that define an air gap and are configured in such a manner that, when a magnetic field travels through at least one of the at least two air gap interfaces, a first region is defined in the air gap having a magnetic flux density greater than a magnetic flux density of a second region defined in the air gap. The current sensing device further includes a magnetic field sensor positioned within the second region of the air gap and external to the first region of the air gap, the magnetic field sensor being configured to sense a magnetic field induced by an electrical current that is conducted through a conductor passing through a central opening of the magnetic core.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 2A is a conceptual diagram illustrating an example current sensing device according to this disclosure.

FIG. 2B is a conceptual diagram illustrating another example current sensing device according to this disclosure.

DETAILED DESCRIPTION

This disclosure is directed to current sensing techniques for use within a magnetic current sensor. In some examples, the techniques in this disclosure may allow for the design, construction, and use of an open loop current sensor having an available bandwidth that is greater than that which is achievable in conventional open loop current sensors that use Hall effect sensors (e.g., FIGS. 1A & 1B). In additional examples, the techniques in this disclosure may allow for the design, construction, and use of an open loop current sensor that uses a magnetic field sensor with a relatively high level of magnetic field sensitivity. For example, the techniques may allow a magnetoresistive magnetic field sensor to be used within an open loop current sensor configuration. The techniques of this disclosure may also be used to improve closed loop current sensors as well as current sensors that use relatively low sensitivity magnetic field sensors.

Figure 1A:
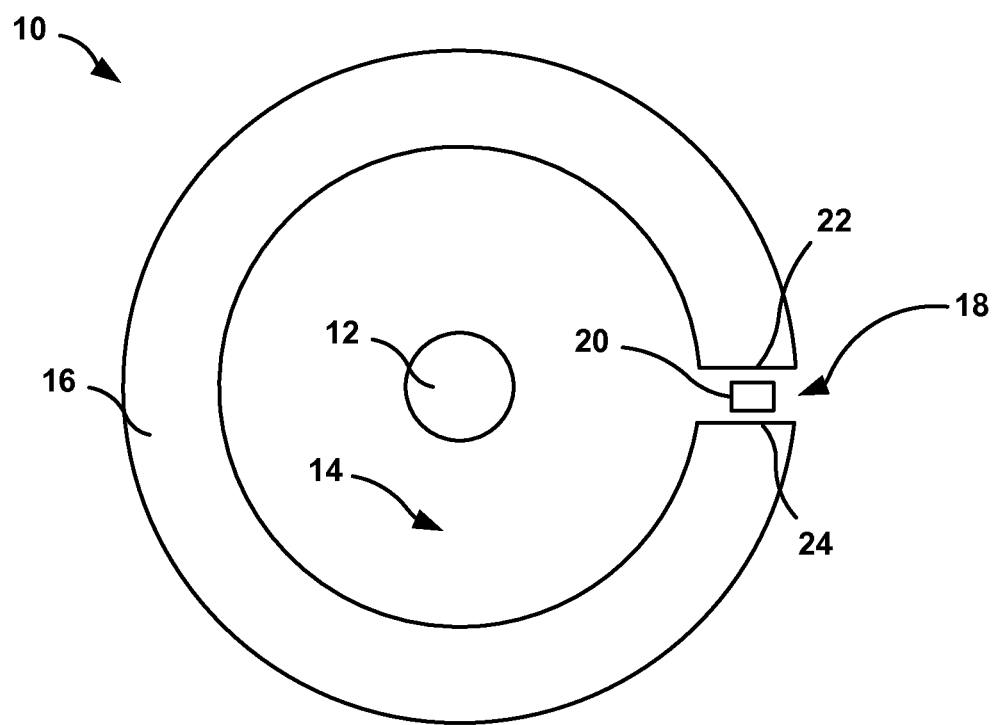
FIG. 1A is a conceptual diagram illustrating a prior art current sense configuration.
Figure 1B:
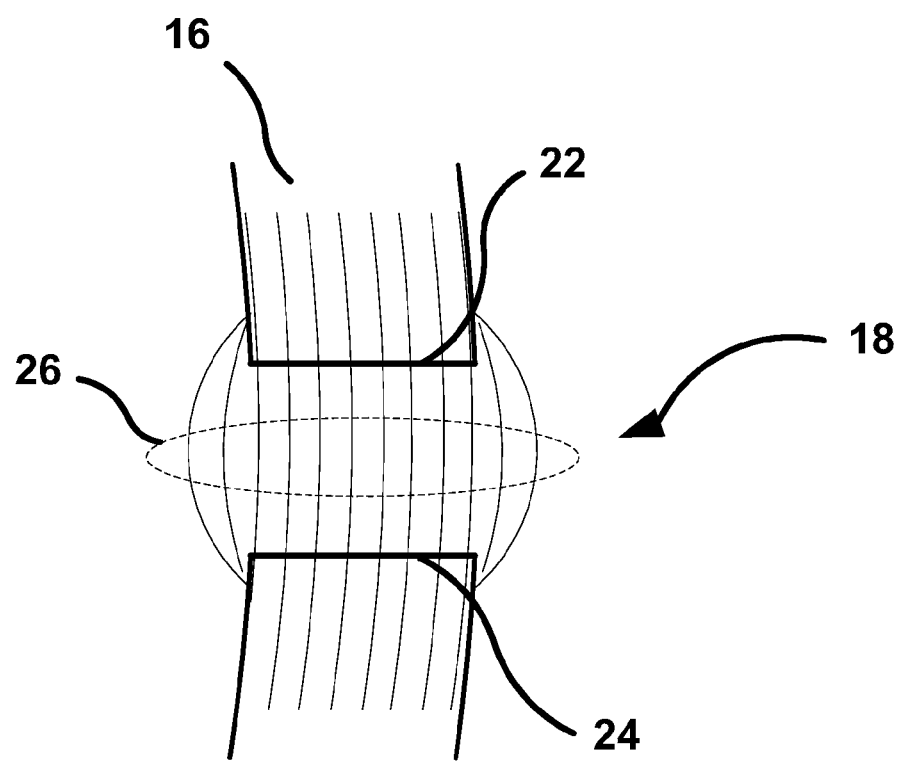
FIG. 1B is a conceptual diagram illustrating the slot-shaped air gap defined by the magnetic core of FIG. 1 and a magnetic field traveling through the air gap.

The conventional open loop current sensor illustrated in FIGS. 1A & 1B uses a Hall effect magnetic field sensor. Hall effect sensors may have a low level of magnetic sensitivity, and as a result, the voltage that is output from such a sensor does not adequately fluctuate over the range of voltages which are needed for the downstream electronics. Thus, a high gain amplifier may be placed between the output of the Hall effect sensor and the downstream electronics to amplify the output of the Hall effect sensor to a voltage level that produces voltages within an acceptable range for the downstream electronics.

The amplifier may be limited by a constant gain bandwidth product (GBW). Therefore, when a high gain amplifier is required, such as may be the case when a Hall effect sensor is used, the bandwidth of the amplifier, and thus the current sensor, may be limited to a level of bandwidth that is smaller than desired.

One way to increase the bandwidth of the current sensor is to use a magnetic field sensor that has a level of magnetic sensitivity which is higher than that of the Hall effect sensor used in conventional open loop configurations. For example, a magnetoresistive sensor may have a magnetic sensitivity that is higher than a Hall effect sensor. When a magnetoresistive sensor is placed within a conventional open loop configuration, such as the architecture described above with respect to FIGS. 1A & 1B, the magnetic field within air gap 18 may be large enough to drive the magnetoresistive sensor into a saturation mode of operation. When the magnetic field sensor is saturated, the current sensing device 10 of FIGS. 1A & 1B may not be able to properly detect the amount of current flowing though conductor 12.

The magnetic flux density of a magnetic field traveling through air gap 18 may decrease as the width (i.e., the distance between the opposing faces 22, 24) of air gap 18 increases. Thus, one way to reduce the magnetic flux density of the magnetic field incident on the magnetic field sensor and to prevent saturation is to increase the width of air gap 18 in the conventional open loop configuration of FIGS. 1A & 1B. Increasing the width of air gap 18, however, may also increase the exposure of the magnetic field sensor to interference from external magnetic fields entering air gap 18. Exposure to high enough levels of external magnetic fields may degrade the performance of the magnetic field sensor and/or prevent proper operation of the current sensor.

This disclosure describes techniques and devices for reducing the magnetic flux density incident upon a magnetic field sensor positioned within an air gap of a magnetic circuit while shielding the magnetic field sensor from excessive levels of external magnetic fields. Reducing the magnetic flux density incident upon the magnetic field sensor allows for the use of a high sensitivity magnetic field sensor within an open loop current sensor configuration. Shielding the magnetic field sensor from excessive levels of external magnetic fields ensures that the operation of the magnetic field sensor will not be impaired when the current sensor operates within a noisy environment (i.e., an environment subject to external magnetic fields). In this manner, the techniques in this disclosure allow a high sensitivity magnetic field sensor (e.g., a magnetoresistive sensor) to be used within an open loop current sensor even when the current sensor is subject to interference from external magnetic fields.

A high sensitivity magnetic field sensor may reduce the amount of gain needed for an amplifier coupled between the output of the magnetic field sensor and the downstream electronic circuitry for the current sensor. Reducing the amount of gain needed for the amplifier may increase the bandwidth over which the current sensor can operate. In some current sensors, the bandwidth at which the amplifier operates may be a limiting factor in determining the bandwidth of the overall current sensing system. Thus, the techniques in this disclosure may be used to increase the available bandwidth for a current sensing system that uses an open loop current sensing device.

In some examples, a high sensitivity magnetic field sensor may allow the amplifier between the magnetic field sensor and the downstream circuitry to be removed altogether, thereby removing a potential bandwidth limiting device from the current sensing system. In addition, removing the amplifier may decrease the area needed to implement the signal conditioning circuitry for the current sensing device.

In additional examples, a magnetic core may be designed such that the magnetic flux density of the magnetic field emitted into the air gap from the magnetic core is within an input operating range (i.e., an input range where the magnetic field sensor will not saturate) of a high sensitivity magnetic field sensor. Because the magnetic core emits a magnetic field into the air gap that has an appropriate level of magnetic flux density for the high sensitivity magnetic field sensor, such a magnetic field sensor may be able to properly operate within the air gap without the need for additional shielding components disposed between the sensor and the magnetic core for reducing the magnitude of the magnetic field of interest.

In some examples, a magnetic core may be designed such that an air gap interface of the magnetic core forms a cavity within the magnetic core. The magnetic field sensor may be positioned substantially within the cavity of the magnetic core. The cavity may be designed such that the magnetic flux density within the cavity is in an appropriate range for operation of the magnetic field sensor in a non-saturated operating mode. The magnetic core surrounding the cavity may form magnetic core extensions which serve to shield the magnetic field sensor from external magnetic fields. In this manner, the magnetic flux density incident on the magnetic field sensor may be reduced without exposing the magnetic field sensor to excessive levels of external magnetic fields.

In further examples, the air gap may be designed such that the width between opposing interfaces of the air gap is variable (i.e., not constant) across the air gap. For example, the distance between the air gap interfaces at the periphery of the interfaces may be less than the distance between the air gap interfaces at an interior point of the interfaces (i.e., a point not at the periphery of the interfaces). In such examples, the distance between the air gap interfaces at the interior point may be configured such that the magnetic flux density within at least a portion of the air gap region is small enough to be within a proper operating range for the magnetic field sensor. The distance between the air gap interfaces at the periphery may be configured such that the amount of external magnetic fields entering the air gap is small enough to prevent interference with the proper operation of the magnetic field sensor. Thus, the variable width air gap may be used to both reduce the magnetic flux density incident on the magnetic field sensor from the magnetic field of interest and reduce the exposure of the magnetic sensor to external magnetic fields.

In additional examples, air gap interfaces for the magnetic core may be designed such that a first air gap region is formed between a first pair of opposing faces of the air gap interfaces, and a second air gap region is formed between a second pair of opposing faces of the air gap interfaces. The distance between the first pair of opposing faces may be less than the distance between the second pair of opposing faces. The magnetic field sensor may be positioned substantially within the second air gap region.

In further examples, air gap interfaces for the magnetic core may be designed such that a first air gap region is formed between a first pair of opposing faces of the air gap interfaces, a second air gap region is formed between a second pair of opposing faces of the air gap interfaces, and a third air gap region is formed between a third pair of opposing faces of the air gap interfaces. The distance between the first pair of opposing faces and the distance between the third pair of opposing faces may each be less than the distance between the second pair of opposing faces. For example, the air gap region may have a "plus-shaped" cross-sectional area as described in further detail in this disclosure.

The techniques in this disclosure may allow for the use of high sensitivity magnetic field sensors within an open loop current sensor. For example, the techniques may allow for the use of magnetoresistive sensors, such as, e.g., an anisotropic magnetoresistive (AMR) sensor, a giant magnetoresistive (GMR) sensor, a tunneling magnetoresistive (TMR) sensor, or any other magnetoresistive sensor within an open loop current sensor.

The techniques in this disclosure may be used to increase the available bandwidth of a current sensing system that uses an open loop current sensing device. In additional examples, the techniques may be used to improve the performance of and/or reduce the cost of closed loop current sensing systems as well as current sensors that use relatively low sensitivity magnetic field sensors.

FIG. 2A is a conceptual diagram of an exemplary current sensing device 50 that includes a plus-shaped air gap region designed according to the techniques in this disclosure. Current sensing device 50 is configured to sense an electrical current flowing through a conductor, and to produce an output signal indicative of the amount or magnitude of electrical current flowing through the conductor. In some examples, the output signal may also be indicative of the direction of current flow through the conductor. Current sensing device 50 includes a magnetic core 52, a conductor 54, and a magnetic field sensor 56.

Magnetic core 52 is configured to confine and/or concentrate a magnetic field into magnetic core 52, and provide a magnetically-permeable pathway for guiding the magnetic field to magnetic field sensor 56. In some examples, the magnetic field concentrated by magnetic core 52 may include a magnetic field that is induced proximate to and/or within magnetic core 52. For example, the magnetic field may be a magnetic field that is induced by a current propagating through conductor 54.

Magnetic core 52 includes inner surface 58 and an outer surface 62. Inner surface 58 faces towards the central axis of magnetic core 52, and may define a central opening 60 (or central region 60) for magnetic core 52. Outer surface 62 faces away from the central axis of magnetic core 52, and may define an external region 64 that is external to magnetic core. The central axis of magnetic core 52 may be the axis around which magnetic core 52 is formed.

In the example, shown in FIG. 2A, magnetic core 52 has an annular-shaped cross-section with a central opening 60. Such a cross-section may correspond three-dimensionally to a toroid-shaped magnetic core or to a torus-shaped magnetic core. However, other shapes may be used for magnetic core 52, such as, e.g., a rectangular-shaped magnetic core, a polygonal-shaped magnetic core, or any other shape that has an opening through which a conductor may pass.

In examples where magnetic core 52 is a torus, two conceptual planes may be defined each of which is perpendicular to the central axis of magnetic core 52 and tangent to a respective side of magnetic core 52. The region between these two conceptual planes and bounded by inner surface 58 may, in some examples, correspond to central region 60. The remaining space may, in such examples, correspond to external region 64.

Similarly, in examples where magnetic core 52 is a toroid, two conceptual planes may be defined each of which is perpendicular to the central axis of magnetic core 52 and flush with a respective side of magnetic core 52. The region between these two conceptual planes and bounded by inner surface 58 may, in some examples, correspond to central region 60. The remaining space may, in such examples, correspond to external region 64.

Magnetic core 52 may be composed of a magnetically-permeable material. In some examples, the magnetically-permeable material may have a relative magnetic permeability that is greater than the relative magnetic permeability of central region 60 and/or external region 64. In further examples, the magnetically-permeable material may have a relative magnetic permeability that is greater than the relative magnetic permeability of air gap 68. Magnetic core 52 may be constructed, for example, from one or more of the following materials: iron, soft iron, silicon steel, silicon-alloyed iron, carbonyl iron, mu-metal, permalloy, electrical steel, ferrite, nickel zinc ferrite, manganese zinc ferrite, nickel, an amorphous magnetic alloy, a nano-crystalline alloy, or any other material having a magnetic permeability greater than that of the area surrounding magnetic core 52.

In some examples, magnetic core 52 may be constructed as a solid magnetic core. In other examples, magnetic core 52 may be constructed as a laminated magnetic core made of thin sheets of magnetically permeable material, such as, e.g., iron. A laminated magnetic core may reduce eddy currents within magnetic core 52.

Magnetic core 52 includes air gap interfaces 66, 68 each of which span from inner surface 58 to outer surface 62. Air gap interfaces 66, 68 define an air gap 70 for magnetic core 52. Magnetic core 52 and air gap 70 may form a magnetic circuit for current sensing device 50. When a current is propagating through conductor 54, a magnetic field may be induced within the magnetic circuit. The induced magnetic field may travel, propagate, or flow through the magnetic circuit, which may include travelling, propagating or flowing through magnetic core 52 and/or air gap 70.

Air gap 70 may be configured to reduce the flux density of a magnetic field travelling through the magnetic circuit. In some examples, air gap 70 may be configured to prevent the magnetic field from saturating within magnetic core 52. Air gap 70 may have a magnetic reluctance which is higher than the magnetic reluctance of magnetic core 52. Similarly, air gap 70 may have a magnetic permeability which is lower than the magnetic permeability of magnetic core 52.

In some examples, air gap 70 may be composed of air. In further examples, air gap 70 may be composed of any material having a relatively low magnetic-permeability, e.g., any material that has a magnetic permeability lower than that of the material out of which magnetic core 52 is constructed. For example, air gap 70 may be composed of nylon, or any other type of non-magnetic material. In some examples, air gap 70 may be in fluid communication with central region 60 and external region 64.

According to this disclosure, air gap 70 may be designed such that one or more cavities 72, 74 are formed within magnetic core 52. Cavities 72, 74 may be designed such that the magnetic flux density of the magnetic field within cavities 72, 74 is within an appropriate range for operation of magnetic field sensor 56 in a non-saturated operating mode. The portions of magnetic core 52 surrounding cavities 72, 74 may form magnetic core extensions 76, 78, 80, 82 which serve to shield the magnetic field sensor from external magnetic fields. In this manner, the magnetic flux density incident on magnetic field sensor 56 may be reduced without exposing magnetic field sensor 56 to excessive levels of external magnetic fields.

Air gap interfaces 66, 68 define cavities 72, 74 within magnetic core 52. Air gap interfaces 66, 68 may be configured such that the magnetic reluctance within cavities 72, 74 is higher than the magnetic reluctance in other regions of air gap 70. Air gap interfaces 66, 68 may be further configured to reduce and/or attenuate a magnetic field that flows into cavities 72, 74 relative to other regions within air gap 70. In some examples, air gap interfaces 66, 68 may be configured to emit a magnetic field into cavities 72, 74 having a magnetic flux density that is within an input operating range of magnetic field sensor 56. As shown in FIG. 2A, magnetic field sensor 56 may be positioned substantially within cavity 72.

Air gap interfaces 66, 68 also define magnetic core extensions 76, 78, 80, 82 for magnetic core 52. Magnetic core extensions 76, 78, 80, 82 may be configured to reduce the exposure of magnetic field sensor 56 to external magnetic fields. For example, magnetic core extensions 76, 78, 80, 82 may route external magnetic fields (e.g., noisy magnetic fields) away from magnetic field sensor 56 and into magnetic core 52. In addition, magnetic core extensions 76, 78, 80, 82 may reduce the width of air gap 70 at the periphery of air gap 70 in order to reduce the amount of external magnetic field entering air gap 70.

Magnetic core extensions 76, 78, 80, 82 may also be configured to reduce the induced magnetic field (i.e., the magnetic field of interest) incident upon magnetic field sensor 56. For example, magnetic core extensions 76, 78, 80, 82 may route a portion of the induced magnetic field around the region in which magnetic field sensor 56 is positioned. In addition, magnetic core extensions 76, 78, 80, 82 may be configured to lower the reluctance in one or more regions of air gap 70 in which magnetic field sensor 56 is not positioned.

Although air gap 70 is illustrated in FIG. 2A as including two cavities 72, 74, in other examples, air gap 70 may contain the same or different number of cavities in the same or different configurations. For example, air gap interface 68 may be designed to not include cavity 74.

Conductor 54 is configured to carry or propagate a current through central opening 60 of magnetic core 52. The current carried by conductor 54 may be the input current or the current-to-be measured by current sensing device 50. In some examples, conductor 54 may be referred to as the primary conductor for current sensing device 50.

Conductor 54 may include two terminals each of which is electrically coupled to a respective one of two current sensing terminals of current sensing device 50. Depending on the logical direction of current flow, one of the current sensing terminals may be referred to as an input current terminal and the other current sensing terminal may be referred to as an output current terminal.

In additional examples, one of the current sensing terminals may be hard-wired to a ground voltage. In such examples, the other terminal may be referred to as the input current terminal, and in such examples, current sensing device 50 may not have an output current terminal.

In further examples, current sensing device 50 may not logically include conductor 54. In such examples, current sensing device 50 receives a magnetic field induced by a logically separate conductor 54 as the input signal for current sensing device 50. Thus, in such examples, current sensing device 50 does not necessarily have electrical input or output current terminals, but rather may have input and output conductor terminals. The input and output conductor terminals may be part a physical structure that is configured in such a manner that, when a conductor is threaded through the physical structure between the input and output conductor terminals, the threaded conductor will pass through central opening 60.

FIG. 2A illustrates conductor 54 as passing through central opening 60 of current sensing device 50 a single time and at a location substantially coinciding with the central axis of magnetic core 52. In other examples, however, conductor 54 may pass through central opening 60 multiple times. In additional examples, conductor 54 may pass through central opening 60 one or more times at locations which are the same as or different from the central axis of magnetic core 52. For example, conductor 54 may be wound around magnetic core 52 such that conductor 54 passes through central opening 60 at the periphery of central opening 60. In such an example, conductor 54 may pass through central opening 60 multiple times corresponding to the number of turns in the winding. When conductor 54 is wound around magnetic core 52, conductor 54 may also be referred to as a primary coil.

Magnetic field sensor 56 is configured to sense a magnetic field incident on the sensor and to generate an output signal indicative of the magnetic flux density of the sensed magnetic field. Because the magnetic field incident on magnetic field sensor 56 is induced into the magnetic circuit by conductor 54, the magnetic flux density of the magnetic field is related to the amount of current flowing through conductor 54. Thus, the output signal produced by magnetic field sensor 56 may be indicative of an amount of current flowing through conductor 54. In some examples, the magnetic flux density of the magnetic field may be proportional to the current flowing through conductor 54. In additional examples, the output signal may also be indicative of the direction of current flow through conductor 54. The output signal may be an electrical signal, such as, e.g., a current-mode signal, a voltage-mode signal, an unmodulated signal, a modulated signal, a single-ended signal, a differential signal, or any other type of electrical signal bearing information.

Magnetic field sensor 56 may have an input operating range and an output operating range, and may be capable of operating in a sensing mode and a saturation mode. Magnetic field sensor 56 may operate in a sensing mode when a magnetic flux density within the input operating range is incident upon magnetic field sensor 56. As used herein, the sensing mode for magnetic field sensor 56 may refer to a mode in which magnetic field sensor 56 is capable of producing an output that is indicative of an amount of magnetic flux density incident upon magnetic field sensor 56. Alternatively, the sensing mode for magnetic field sensor 56 may refer a mode in which magnetic field sensor 56 is not saturated. In some examples, the sensing mode may be a linear mode. When magnetic field sensor 56 is operating in the sensing mode, magnetic field sensor 56 may produce an output signal that is within the output operating range of magnetic field sensor 56.

Magnetic field sensor 56 may operate in a saturation mode when a magnetic flux density outside of the input operating range is incident upon magnetic field sensor 56. As used herein, the saturation mode for magnetic field sensor 56 may refer to a mode in which magnetic field sensor 56 produces a saturated output signal. In some examples, a saturated output signal may not be indicative of an amount of magnetic flux density incident upon magnetic field sensor 56. When magnetic field sensor 56 is operating in the saturation mode, magnetic field sensor 56 may, in some examples, produce an output signal that is outside of the output operating range of magnetic field sensor 56.

Magnetic field sensor 56 may have a magnetic field sensitivity associated with the sensor. As used herein, the magnetic field sensitivity for a magnetic field sensor may refer to the ratio of the amount of change in the output signal to the amount of change in the magnetic flux density incident on the magnetic field sensor. A magnetic field sensor with a relatively high magnetic sensitivity may be referred to herein as a high sensitivity magnetic field sensor. Similarly, a magnetic field sensor with a relatively low magnetic sensitivity may be referred to herein as a low sensitivity magnetic field sensor.

In general, magnetic field sensor 56 may be implemented as any type of sensor that is capable of sensing a magnetic field and generating an electrical signal that is indicative of the magnetic flux density of the sensed magnetic field. In some examples, magnetic field sensor 56 may be a magnetoresistive magnetic field sensor. A magnetoresistive magnetic field sensor may include an anisotropic magnetoresistive (AMR) sensor, a giant magnetoresistive (GMR) sensor, and a tunneling magnetoresistive (TMR) sensor, or any other sensor that uses the magnetoresistive effect as a principle of operation. For example, such a sensor may be constructed such that a magnetic field causes a change in the resistivity of a material through which a current travels.

In additional examples, magnetic field sensor 56 may be a Hall effect sensor. Such a sensor may use the Hall effect or Lorentz force as a principle of operation. For example, a bias current may be induced between one end of a semiconductor slab and another end of a semiconductor slab, e.g., by applying a voltage between the two ends of the slab. The magnetic field to-be-measured may be applied perpendicular to the slab. The Lorentz force causes the charge carriers to be deflected to the side of the semiconductor slab perpendicular to the direction of current flow. The deflected charge carriers generate a voltage across the sides of the slab sufficient to counteract the Lorentz force. The voltage across the sides of the slab (i.e., the Hall voltage) may be measured to determine the magnetic flux density of the magnetic field.

Magnetic field sensor 56 may be positioned into cavity 72 of air gap 70 using a variety of techniques. In some examples, current sensing device 50 may be implemented on a circuit board (not shown). The side face of magnetic core 52 may be affixed to the circuit board, and magnetic field sensor 56 may also be affixed to the circuit board in such a manner that magnetic field sensor 56 is positioned into cavity 72. Thus, the circuit board may be used as a means of positioning magnetic field sensor 56 within a particular region of air gap 70. Other positioning techniques may also be used to position magnetic field sensor 56 within a particular region of air gap 70.

Similar to magnetic field sensor 56, current sensing device 50 may have an input operating range and an output operating range, and may be capable of operating in a sensing mode and a saturation mode. Current sensing device 50 may operate in a sensing mode when a current within the input operating range flows through conductor 54. As used herein, the sensing mode for current sensing device 50 may refer to a mode in which current sensing device 50 is capable of producing an output that is indicative of an amount of current flowing through conductor 54. Alternatively, the sensing mode for current sensing device 50 may refer a mode in which current sensing device 50 is not saturated. In some examples, the sensing mode may be a linear mode. When current sensing device 50 is operating in the sensing mode, current sensing device 50 may produce an output signal that is within the output operating range of current sensing device 50.

Current sensing device 50 may operate in a saturation mode when a current outside of the input operating range flows through conductor 54. As used herein, the saturation mode for current sensing device 50 may refer to a mode in which magnetic field sensor 56 produces a saturated output signal. In some examples, a saturated output signal may not be indicative of the amount of current flowing through conductor 54. When current sensing device 50 is operating in the saturation mode, current sensing device 50 may, in some examples, produce an output signal that is outside of the output operating range of current sensing device 50.

Current sensing device 50 may also have a current sensitivity associated with the device. As used herein, the current sensitivity for current sensing device 50 may refer to the ratio of the amount of change in the output signal to the amount of change in the current flowing through a conductor that passes through the central opening of a magnetic core within current sensing device 50. A current sensing device with a relatively high current sensitivity may be referred to herein as a high sensitivity current sensing device. Similarly, a current sensor with a relatively low current sensitivity may be referred to herein as a low sensitivity current sensing device.

In some examples, current sensing device 50 may operate in an open loop configuration. An open loop configuration may refer to a sensor configuration that does not include a feedback path from the output of magnetic field sensor 56 to magnetic core 52. More specifically, in an open loop configuration, magnetic core 52 may not include a secondary coil that provides feedback from the output of magnetic field sensor 56 or a point downstream therefrom. In further examples, an open loop configuration may also refer to a sensor configuration where the magnetic field sensor 56 does not receive a differential input signal. In other words, the magnetic field within the magnetic circuit may be proportional to the current flowing through conductor 54 as opposed to the difference between such a current and the output signal of magnetic field sensor 56.

In other examples, current sensing device 50 may operate in a closed loop configuration (not shown). In some examples, a closed loop configuration may refer to a sensor configuration that includes a feedback path from the output of magnetic field sensor 56 to magnetic core 52. More specifically, in a closed loop configuration, magnetic core 52 may include a secondary coil that provides feedback from the output of magnetic field sensor 56 or a point downstream therefrom. In further examples, a closed loop configuration may also refer to a sensor configuration where the magnetic field sensor 56 receives a differential input signal. In other words, the magnetic field within the magnetic circuit may be proportional to a difference between the current flowing through conductor 54 and the output signal of magnetic field sensor 56.

During operation, a current-to-be-measured flows through conductor 54, which induces a magnetic field in a magnetic circuit formed by magnetic core 52 and air gap 70. The magnetic flux density of the magnetic field induced in magnetic core 52 may be proportional to the magnitude of the current flowing through conductor 54. The induced magnetic field may be referred to as a magnetic field of interest to distinguish such a magnetic field from an external magnetic field (i.e., noise).

Air gap interfaces 66, 68 condition the magnetic field such that the magnetic flux density of the magnetic field flowing through cavities 72, 74 is less than the magnetic flux density of the magnetic field flowing through other regions of air gap 70. In some examples, air gap interfaces 66, 68 condition the magnetic field such that the magnetic flux density in cavities 72, 74 is within an input operating range of magnetic field sensor 56. Magnetic core extensions 76, 78, 80, 82 route external magnetic fields away from magnetic field sensor 56 and air gap 70.

Magnetic field sensor 56 receives a magnetic field incident upon magnetic field sensor 56. The received magnetic field 56 may contain a component corresponding to the induced magnetic field (i.e., the magnetic field of interest). In some examples, the received magnetic field 56 may also contain a component corresponding to an external magnetic field (i.e., noise). In such examples, the component corresponding to the external magnetic field may be small enough to not interfere with the proper sensing of the magnetic field of interest.

Magnetic field sensor 56 converts the received magnetic field into an electrical signal (e.g., a voltage) that corresponds to the magnetic flux density of the magnetic field incident upon magnetic field sensor 56. Because the magnetic flux density is related to the amount of current flowing through conductor 54, the electrical signal produced by magnetic field sensor 56 may be representative of the amount of current flowing through conductor 54.

In some examples, the output of magnetic field sensor 56 may be fed into an amplifier and the amplified signal may be fed into downstream circuitry. In other examples, the output of magnetic field sensor 56 may be directly fed into downstream circuitry without necessarily amplifying the signal.

The design of the air gap interfaces 66, 68 of magnetic core 52 may allow high sensitivity magnetic field sensors to be used within an open loop configuration for current sensing device 50. Using magnetic field sensors that have a high level of sensitivity may reduce the gain required in a downstream amplifier, which may in turn increase the available bandwidth for the amplifier. The bandwidth at which the downstream amplifier operates may be a limiting factor in the bandwidth of the overall current sensing device 50. Thus, the techniques in this disclosure may be used to increase the available bandwidth for current sensing within an open loop current sensor configuration.

Although the example current sensing device 50 in FIG. 2A is illustrated as including an air gap having a plus-shaped cross-sectional area, the techniques in this disclosure may be implemented with other types of air gap geometries designed to reduce the magnetic flux density of the induced magnetic field within a region of the air gap while shielding the same region of the air gap from excessive levels of noise caused by external magnetic fields.

FIG. 2B is a conceptual diagram illustrating another example current sensing device 90 according to this disclosure. The structure of current sensing device 90 is similar to that of current sensing device 50 shown in FIG. 2A, except that magnetic field sensor 56 has been positioned substantially within cavity 74 rather than within cavity 72 as shown in FIG. 2A. Similar numbered components in FIGS. 2A & 2B have the same or similar construction and functionality. Accordingly, in the interest of brevity and to avoid redundancy, the structure and operation of these shared components is not described in further detail.

Figure 3:
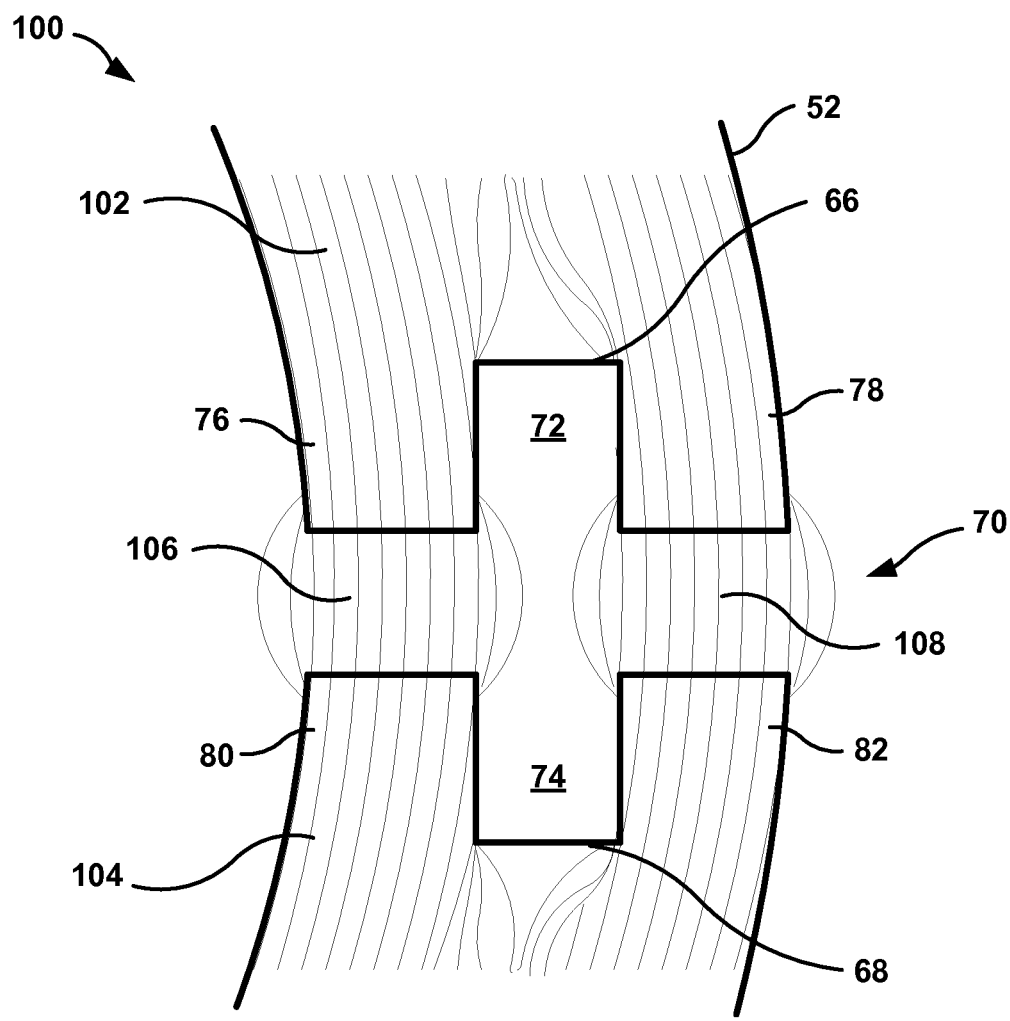
FIG. 3 is a conceptual diagram illustrating a magnetic field flowing through the plus-shaped air gap illustrated in FIGS. 2A & 2B.

FIG. 3 is a conceptual diagram 100 illustrating a magnetic field flowing through the plus-shaped air gap illustrated FIGS. 2A & 2B. Conceptual diagram 100 depicts magnetic flux lines travelling through a first portion 102 of magnetic core 52, air gap 70, and a second portion 104 of magnetic core 52. The magnetic flux lines are indicative of a direction at which magnetic field is traveling. The density of the magnetic flux lines in a given region may be indicative of the magnetic flux density or magnetic induction of the magnetic field in that particular region.

As shown in FIG. 3, the shape of air gap interfaces 66, 68 causes a higher density of magnetic flux lines to flow through regions 106 and 108 of air gap 70 than through cavities 72, 74. In other words, magnetic core extensions 76, 78, 80, 82 may route a substantial portion of the magnetic field around cavities 72, 74. Thus, a magnetic field sensor with increased sensitivity may be positioned within one of cavities 72, 74 without causing saturation of the magnetic field sensor.

FIG. 3 does not illustrate any magnetic flux lines travelling through cavities 72, 74 to conceptually depict the relatively low magnetic flux density in cavities 72, 74. However, it is recognized that at least a small amount of magnetic flux does travel through cavities 72, 74 so that a magnetic field sensor 56 positioned within one of cavities 72, 74 may properly detect the magnitude of the magnetic field.

The magnetic field lines and densities illustrated in conceptual diagram 100 are provided merely to depict general concepts of this disclosure. As such, it is understood that conceptual diagram 100 is not intended to be a mathematically or physically rigorous depiction of a magnetic field travelling through magnetic core 52 and air gap 70.

Figure 4:
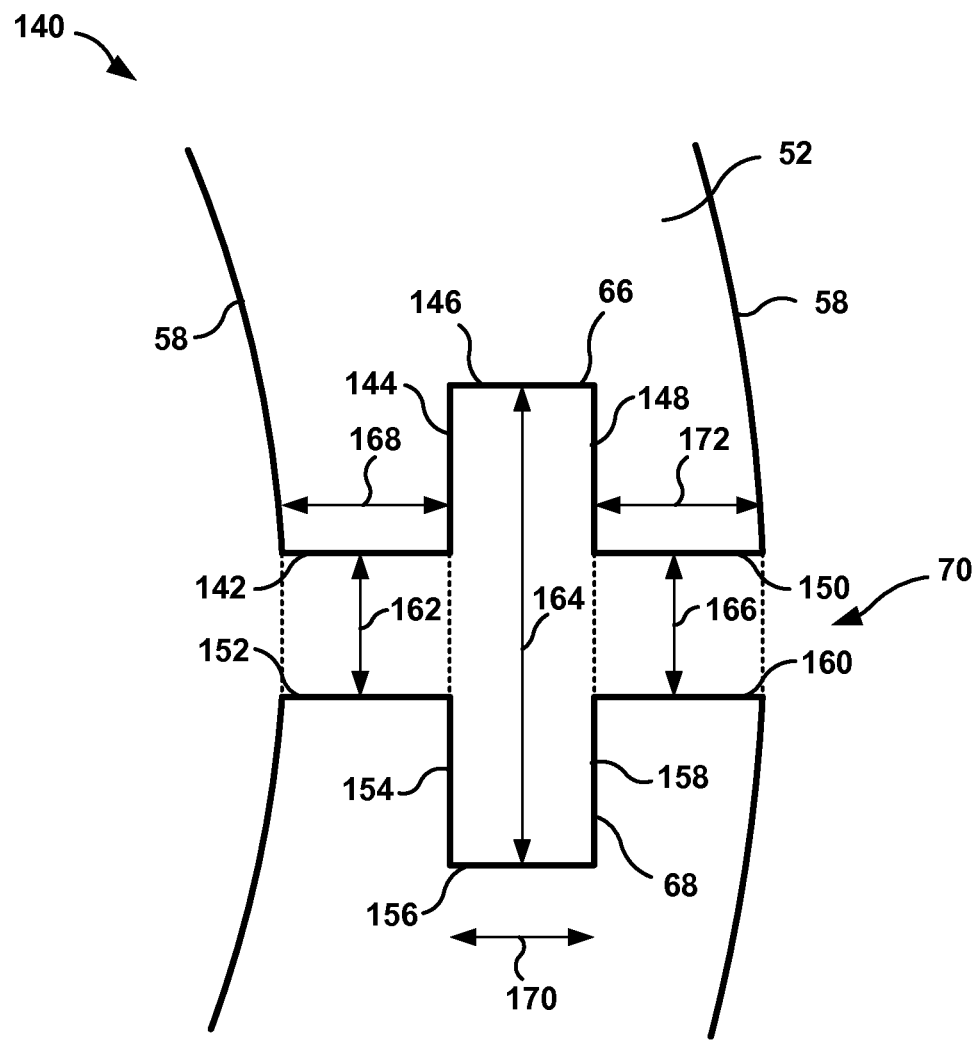
FIG. 4 is a conceptual diagram illustrating the dimensions of the air gap interfaces of the plus-shaped air gap shown in FIGS. 2A & 2B in greater detail.

FIG. 4 is a conceptual diagram 140 illustrating the air gap interfaces 66, 68 of the plus-shaped air gap shown in FIGS. 2A & 2B in greater detail. As shown in FIG. 4, air gap interface 66 includes interface portions 142, 144, 146, 148, 150, and air gap interface 68 includes interface portions 152, 154, 156, 158, 160.

A first end of interface portion 142 may be connected to inner surface 58 and a second end of interface portion 142 may be connected a first end of interface portion 144. A second end of interface portion 144 may be connected to a first end of interface portion 146, a second end of interface portion 146 may be connected to a first end of interface portion 148, a second end of interface portion 148 may be connected to a first end of interface portion 150, and a second end of interface portion 150 may be connected to outer surface 62.

Similarly, a first end of interface portion 152 may be connected to inner surface 58 and a second end of interface portion 152 may be connected a first end of interface portion 154. A second end of interface portion 154 may be connected to a first end of interface portion 156, a second end of interface portion 156 may be connected to a first end of interface portion 158, a second end of interface portion 158 may be connected to a first end of interface portion 160, and a second end of interface portion 160 may be connected to outer surface 62.

As shown in FIG. 4, interface portions 142 and 152 are substantially parallel to one another, interface portions 146 and 156 are substantially parallel to one another, and interface portions 150 and 160 are substantially parallel to one another. In other examples, however, one or more of the pairs of opposing interface portions may not be parallel to one another.

FIG. 4 also illustrates that interface portions 142, 146 and 150 are substantially parallel to each other, interface portions 152, 156 and 160 are substantially parallel to each other, and that interface portions 144, 148, 154 and 158 are substantially parallel to each other. In other examples, however, one or more combinations of these interface portions may not be parallel to each other.

In addition, FIG. 4 illustrates that interface portion 144 is substantially perpendicular to interface portions 142 and 146, interface portion 148 is substantially perpendicular to interface portions 146 and 150, interface portion 154 is substantially perpendicular to interface portions 152 and 156, interface portion 158 is substantially perpendicular to interface portions 156 and 160. In other examples, however, one or more combinations of these interface portions may not be substantially perpendicular.

Interface portions 142 and 152 may form a first pair of opposing faces between which a first region within air gap 70 is defined. Similarly, interface portions 146 and 156 may form a second pair of opposing faces between which a second region within air gap 70 is defined, and interface portions 150 and 160 may form a third pair of opposing faces between which a third region within air gap 70 is defined. In some examples, the regions may be non-overlapping regions (i.e., the regions do not overlap one another) as indicated by the dashed lines in FIG. 4.

A first distance 162 for the first region may be defined as the distance between interface portions 142 and 152. Similarly, a second distance 164 for the second region may be defined as the distance between interface portions 146 and 156, and a third distance 166 for the third region may be defined as the distance between interface portions 150 and 160. In some examples, the distance between two interface portions may be the shortest or minimum length between the two interface portions.

In further examples, first distance 162 may correspond to the distance between interface portion 142 and air gap interface 68, second distance 164 may correspond to the distance between interface portion 146 and air gap interface 68, and third distance 166 may correspond to the distance between interface portion 150 and air gap interface 68. In some examples, the distance between an interface portion and an air gap interface may be the shortest or minimum length between the interface portion and the air gap interface opposite the interface portion.

First distance 162 and third distance 166 may, in some examples, each be less than second distance 164. In additional examples, first distance 162 and third distance 166 may be substantially equal to each other.

In some examples, the values for first distance 162, second distance 164, and third distance 166 may be selected based on a predetermined level of current to be sensed by current sensing device 50. For example, the predetermined level of current may specify a level of current which current sensing device 50 is designed to sense. In some examples, the predetermined level of current may be a predetermined range of current within which current sensing device 50 is designed to measure current (e.g., the input operating range of current sensing device 50).

Adjusting the values of distances 162, 164, 166 may affect the magnitude of the magnetic flux density for the magnetic field incident on magnetic field sensor 56. Thus, values for one or more of distances 162, 164, 166 may be selected such that the magnetic flux density incident upon the magnetic field sensor 56 is within an input operating range of the magnetic field sensor 56 when the current flowing through conductor 54 is within the predetermined level or range of current.

In additional examples, the ratio between second distance 164 and first distance 162 may be selected based on the predetermined level of current. In further examples, the ratio between second distance 164 and third distance 166 may be selected based on the predetermined level of current. As used herein, the ratio between second distance 164 and first distance 162 may refer to the quotient of second distance 164 divided by first distance 162. Similarly, as used herein, the ratio between second distance 164 and third distance 166 may refer to the quotient of second distance 164 divided by third distance 166.

In some examples, as either of these ratios increases, the magnetic flux density for the magnetic field of interest incident upon the magnetic field sensor 56 may decrease. Thus, either of the ratios may be increased in order to increase the maximum level of current at which current sensing device 50 can sense. Conversely, as either of these ratios decreases, the magnetic flux density for the magnetic field of interest incident upon the magnetic field sensor 56 may increase. Thus, either of the ratios may be decreased in order to decrease the maximum level of current at which current sensing device 50 can sense.

A first width 168 for the first region may be defined as the length of either of interface portions 142 and 152. Similarly, a second width 170 for the second region may be defined as the length of either of interface portions 146 and 156, and a third width 172 for the third region may be defined as the length of either of interface portions 150 and 160.

In some examples, first width 168 and third width 172 may be approximately equal to each other. In further examples, third width 172 may be greater than first width 168, which may increase the efficacy of magnetic core extensions 78, 82 in shielding magnetic field sensor from noise due to external magnetic fields.

First width 168 and/or third width 172 may, in some examples, be selected based on a predetermined level of external magnetic field noise to which the current sensing device may be subject during operation. The predetermined level of external magnetic field may specify an expected level of external magnetic field noise present in the environment in which current sensing device 50 is designed to be used. The predetermined level of external magnetic field noise may correspond to a level of magnetic flux density for the external magnetic field noise. In some examples, the predetermined level of current may be a predetermined range of expected external magnetic field noise present in the environment in which current sensing device 50 is designed to be used.

Adjusting the values of widths 168 and/or 172 may affect the magnitude of the magnetic flux density for an external magnetic field incident on magnetic field sensor 56, which in turn may affect the signal-to-noise ratio (SNR) of the composite magnetic field (e.g., magnetic field of interest+external noise) incident upon magnetic field sensor 56. Thus, values for one or more of widths 168 and 172 may be selected such that the SNR for the composite magnetic field incident upon magnetic field sensor 56 is within a predetermined range.

Adjusting the values of widths 168 and/or 172 may also affect the amount of the external magnetic field noise absorbed by magnetic core 52. If the amount of the external magnetic field noise absorbed by magnetic core 52 is too high, then magnetic core 52 may saturate thereby preventing the magnetic field of interest from being detected by magnetic field sensor 56. Thus, values for one or more of widths 168 and 172 may be selected such that the amount of the external magnetic field noise absorbed by magnetic core 52 is less than the minimum amount of magnetic field noise needed to saturate magnetic core 52.

The length of interface portions 144 and 148 may, in some examples, correspond to the depth of cavity 72. Similarly, the length of interface portions 154 and 158 may, in some examples, correspond to the depth of cavity 74.

Figure 5:
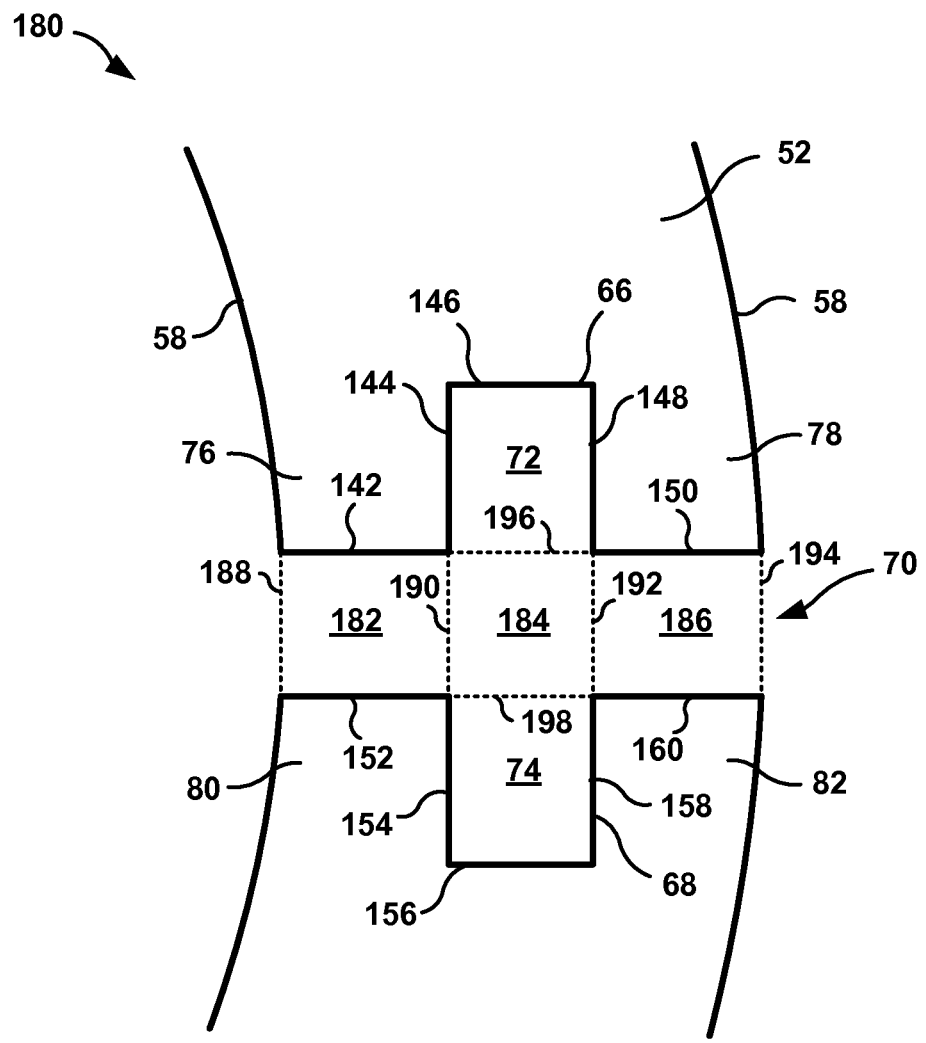
FIG. 5 is a conceptual diagram illustrating the air gap regions of the plus-shaped air gap shown in FIGS. 2A & 2B in greater detail.

FIG. 5 is a conceptual diagram 180 illustrating air gap regions 182, 184, 186 of the plus-shaped air gap shown in FIGS. 2A & 2B in greater detail. As shown in FIG. 5, a conceptual line 188 may be defined between a point located at the intersection of inner surface 58 and air gap interface 66 and a point located at the intersection of inner surface 58 and air gap interface 68. A conceptual line 190 may be defined between a point located at the intersection of interface portions 142 and 144 and a point located at the intersection of interface portions 152 and 154.

Similarly, a conceptual line 192 may be defined between a point located at the intersection of interface portions 148 and 150 and a point located at the intersection of interface portions 158 and 160. A conceptual line 194 may be defined between a point located at the intersection of outer surface 62 and air gap interface 66 and a point located at the intersection of outer surface 62 and air gap interface 68.

In addition, a conceptual line 196 may be defined between a point located at the intersection of interface portions 142 and 144 and a point located at the intersection of interface portions 148 and 150. A conceptual line 198 may also be defined between a point located at the intersection of interface portions 152 and 154 and a point located at the intersection of interface portions 158 and 160.

A first region 182 of air gap 70 may be bounded by interface portions 142 and 152 and by conceptual lines 188 and 190. A second region 184 of air gap 70 may be bounded by interface portions 144, 146, 148, 154, 156 and 158 and by conceptual lines 190 and 192. A third region 186 of air gap 70 may be bounded by interface portions 150 and 160 and by conceptual lines 192 and 194.

In some examples, the magnetic reluctance in second region 184 may be greater than the magnetic reluctance in one or both of first region 182 and third region 186. In further examples, when a magnetic field induced in magnetic core 52 travels through air gap 70, the magnetic flux density of the magnetic field in second region 184 may be less than the magnetic flux density of the magnetic field in one or both of first region 182 and third region 186. Conversely, the magnetic flux density of the magnetic field in one or both of first region 182 and third region 186 may greater than the magnetic flux density of the magnetic field in second region 184.

According to this disclosure, a magnetic field sensor may be positioned substantially within second region 184. The reduced magnetic flux density of second region 184 relative to regions 182 and 186 may allow a magnetic sensor with a high degree of magnetic sensitivity to be used within the current sensing device without causing the sensor to operate within a saturation region.

Moreover, because the distance 162 of the first region 182 and the distance 166 of the third region 186 are less than the distance 164 of the second region 184, the first region 182 and the third region 186 may provide additional shielding from external magnetic fields for a magnetic current sensor positioned within second region 184. In this manner, a magnetic field sensor having a high degree of magnetic sensitivity can be used within the current sensing device without causing the sensor to operate within a saturation region and without causing the sensor to be exposed to excessive interference from external magnetic fields.

In additional examples, cavities 72 and 74 may be formed within a subset of second region 184. For example, cavity 72 may be formed by interface portions 144, 146 and 148, and bounded by interface portions 144, 146 and 148 and conceptual line 196. Similarly, cavity 74 may be formed by interface portions 154, 156 and 158, and bounded by interface portions 154, 156 and 158 and conceptual line 198. In some examples, a magnetic field sensor may be positioned substantially within one of cavities 72, 74. When the magnetic field sensor is positioned within cavity 72, the magnetic field sensor may, in some examples, be positioned between interface portions 144 and 148 (e.g., substantially within a region formed between interface portions 144 and 148). When the magnetic field sensor is positioned within cavity 74, the magnetic field sensor may, in some examples, be positioned between interface portions 154 and 158 (e.g., substantially within a region formed between interface portions 154 and 158).

When a magnetic field induced in magnetic core 52 travels through air gap 70, the magnetic flux density of the magnetic field in cavities 72, 74 may be less than the magnetic flux density of the magnetic field in other regions of air gap 70 including first region 182 and third region 186. In some examples, the magnetic flux density of the magnetic field in cavities 72, 74 may be less than the magnetic flux density of the magnetic field in other portions of second region 184. The reduced magnetic flux density of cavities 72, 74 relative to other regions within air gap 70 may allow a magnetic field sensor with a high degree of magnetic sensitivity to be used within the current sensing device without causing the sensor to operate within a saturation region.

Moreover, the magnetic core extensions 76, 78, 80, 82 surrounding cavities 72, 74 provide additional shielding from external magnetic fields for a magnetic field sensor placed within one of cavities 72, 74. In this manner, a magnetic field sensor having a high degree of magnetic sensitivity can be used within the current sensing device without causing the sensor to operate within a saturation region and without causing the sensor to be exposed to excessive interference from external magnetic fields.

Figure 6A:
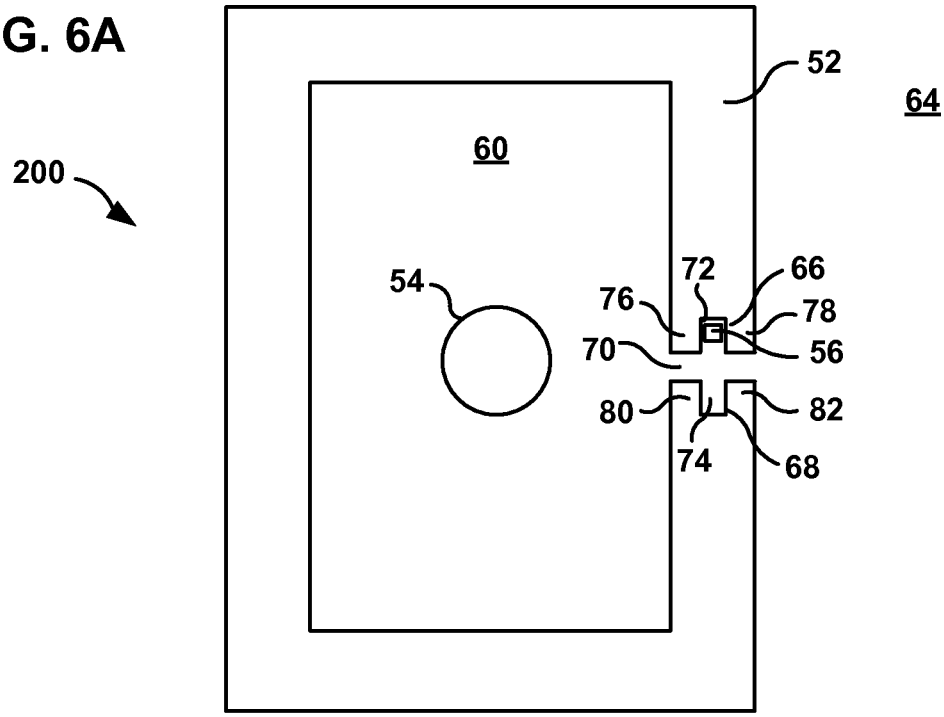
FIG. 6A is a conceptual diagram illustrating another example current sensing device according to this disclosure.

FIG. 6A is a conceptual diagram illustrating another example current sensing device 200 according to this disclosure. The structure of current sensing device 200 in FIG. 6A is similar to that of current sensing device 50 shown in FIG. 2A, except that magnetic core 52 has a rectangular shaped cross-section rather than a circular shaped cross-section. Similar numbered components in FIGS. 2A & 6A have the same or similar construction and functionality. Accordingly, in the interest of brevity and to avoid redundancy, the structure and operation of these shared components is not described in further detail.

Figure 6B:
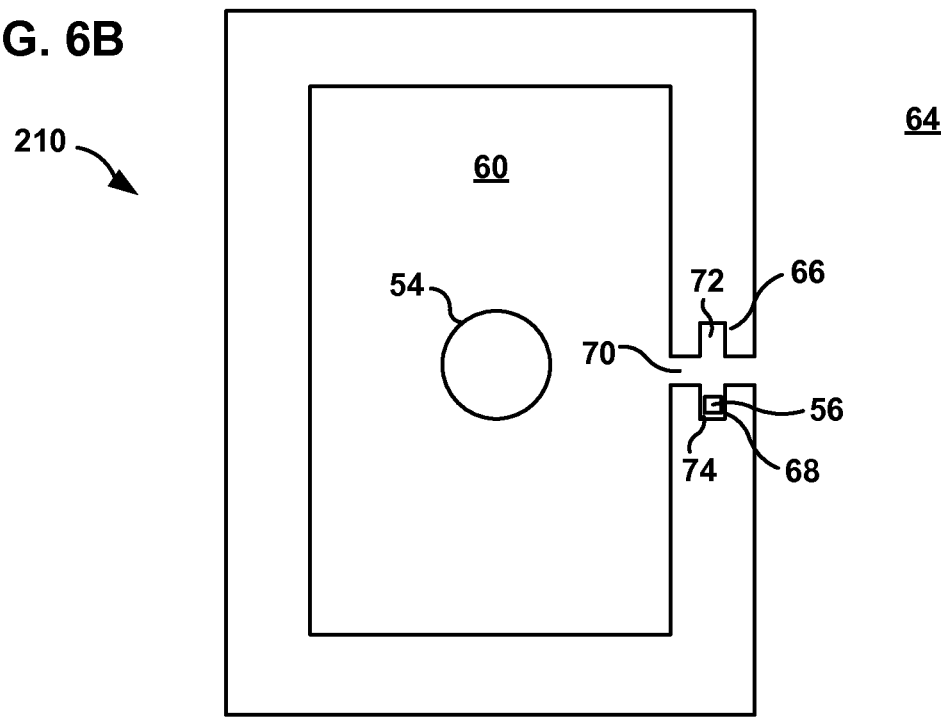
FIG. 6B is a conceptual diagram illustrating another example current sensing device according to this disclosure.

FIG. 6B is a conceptual diagram illustrating another example current sensing device 210 according to this disclosure. The structure of current sensing device 210 is similar to that of current sensing device 90 shown in FIG. 2B, except that magnetic core 52 has a rectangular shaped cross-section rather than a circular shaped cross-section. Similar numbered components in FIGS. 2B & 6B have the same or similar construction and functionality. Accordingly, in the interest of brevity and to avoid redundancy, the structure and operation of these shared components is not described in further detail.

Figure 7:
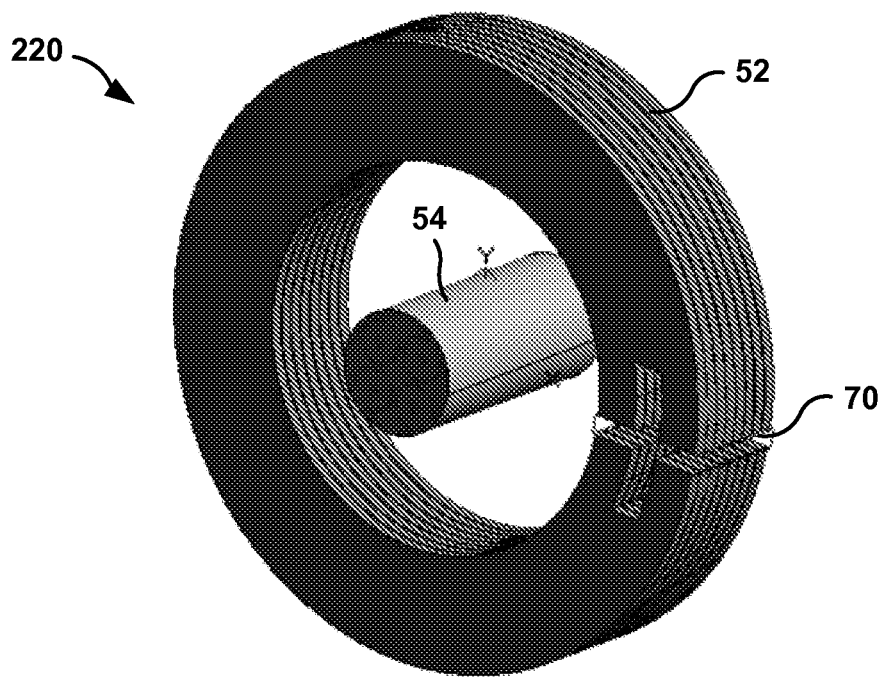
FIG. 7 is a perspective view of another example current sensing device according to this disclosure.

FIG. 7 is a perspective view of another example current sensing device 220 according to this disclosure. Current sensing device includes a magnetic core 52, a conductor 54, and a magnetic field sensor (not shown) positioned within air gap 70. The structure of current sensing device 220 is similar to that of current sensing device 50 shown in FIG. 2A, except that magnetic core 52 is shown explicitly as a laminated core, and air gap 70 is shaped in a different manner as explained in further detail below with respect to FIG. 8. Similar numbered components in FIGS. 2A & 7 have the same or similar construction and functionality. Accordingly, in the interest of brevity and to avoid redundancy, the structure and operation of these shared components is not described in further detail.

As shown in FIG. 7, magnetic core 52 may include a plurality of lamination sheets, each of which may include an insulated sheet of magnetically-permeable material, such as, e.g., iron. Each lamination sheet may receive and transport a small fraction of the magnetic field travelling through magnetic core. The insulated sheets of magnetic material may reduce eddy currents within magnetic core 52. Although FIG. 7 explicitly illustrates a current sensing device 220 that uses a lamination core, in other examples, the current sensing device of FIG. 7 may be implemented with a solid magnetic core.

Figure 8:
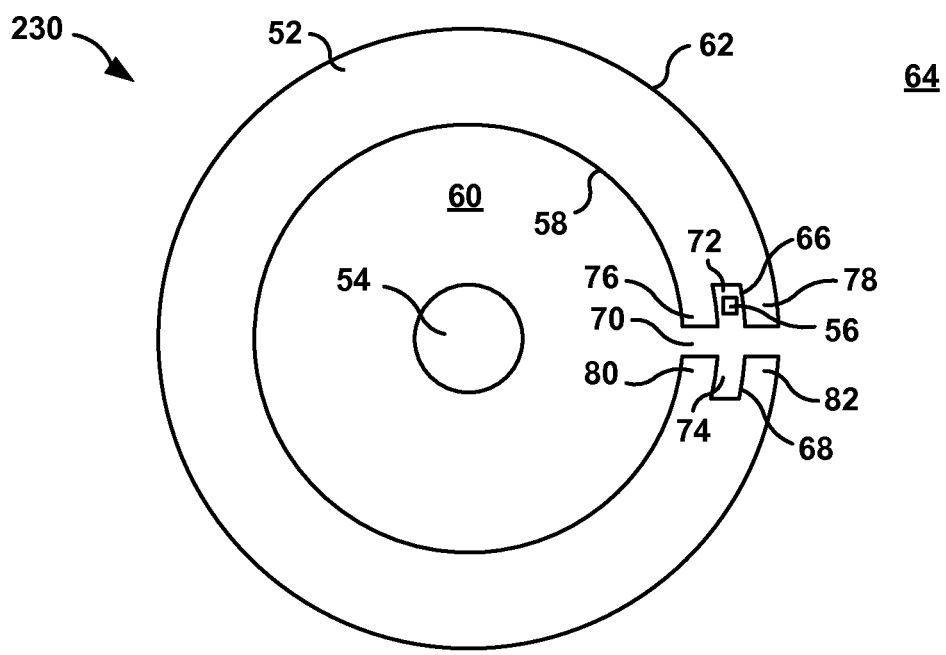
FIG. 8 is a cross-sectional view of the current sensing device of FIG. 7.

FIG. 8 is a cross-sectional view 230 of the current sensing device 220 of FIG. 7. The structure of current sensing device 220 of FIG. 8 is similar to that of current sensing device 50 shown in FIG. 2A, except that air gap 70 is shaped in a different manner as explained in further detail below. Similar numbered components in FIGS. 2A & 8 have the same or similar construction and functionality. Accordingly, in the interest of brevity and to avoid redundancy, the structure and operation of these shared components is not described in further detail.

Magnetic core 52 includes air gap interfaces 66 and 68. Air gap interfaces 66 and 68 are similar to the air gap interfaces depicted in FIGS. 4 & 5 except that interfaces portions 144, 148, 154 and 158 are shaped in a curvilinear or arciform fashion as opposed to a straight line fashion as illustrated in FIGS. 4 & 5. The curvature of interface portions 144, 148, 154 and 158 for air gap interfaces 66 and 68 may be defined by a circle that has a center point at substantially the same location as the center point of the circles that form magnetic core 52.

Figure 9:
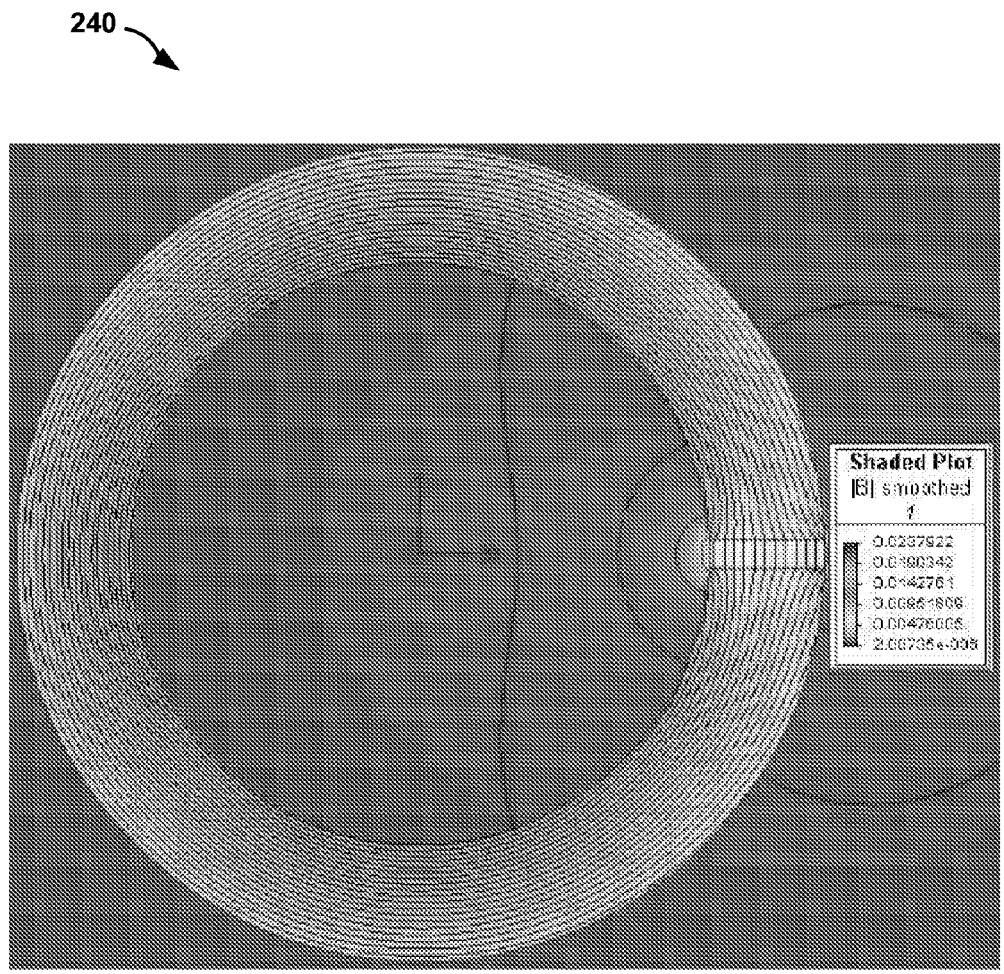
FIG. 9 is a conceptual diagram illustrating a simulation of a magnetic field traveling through the prior art current sense configuration of FIG. 1A.

FIG. 9 is a conceptual diagram 240 illustrating a simulation of a magnetic field traveling through the prior art current sense configuration of FIG. 1A. As shown in FIG. 9, the magnetic flux density of the magnetic field is substantially uniform throughout the air gap of the magnetic core.

Figure 10:
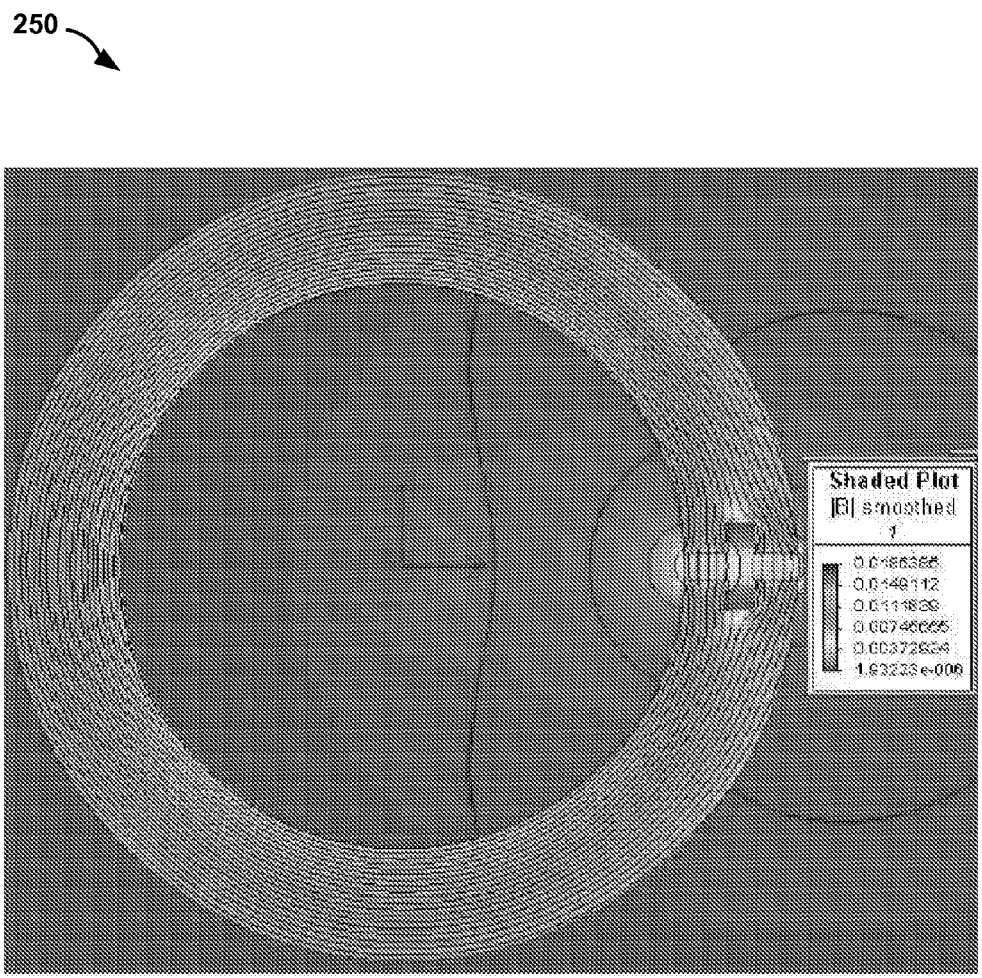
FIG. 10 is a conceptual diagram illustrating a simulation of a magnetic field traveling through the current sensing device of FIG. 2A according to this disclosure.

FIG. 10 is a conceptual diagram 250 illustrating a simulation of a magnetic field traveling through the current sensing device of FIG. 2A. As shown in FIG. 10, the air gap interfaces designed in accordance with this disclosure cause the magnetic flux density of the magnetic field flowing through the cavities to be substantially less than the magnetic flux density in other regions of the air gap.

Figure 11:
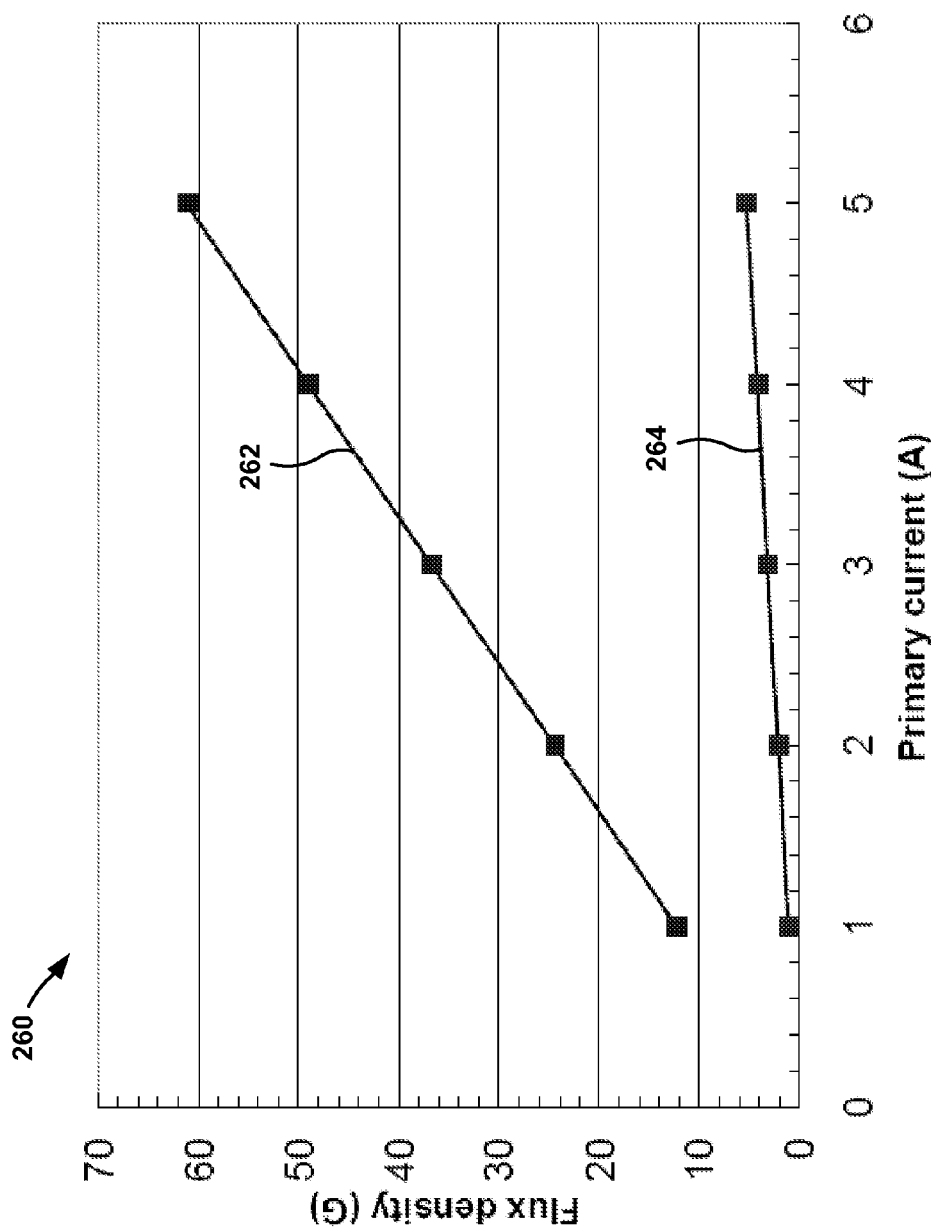
FIG. 11 is a chart comparing the relationship between the magnetic flux density incident on a magnetic field sensor verses the amount of current flowing through the conductor for the current sense configuration of FIG. 1A and the current sensing device of FIG. 2A.

FIG. 11 is a chart 260 comparing the relationship between the magnetic flux density incident on a magnetic field sensor verses the amount of current flowing through the conductor for the prior art current sense configuration of FIG. 1A and the current sensing device of FIG. 2A. Line plot 262 illustrates the relationship between the magnetic flux density incident on a magnetic field sensor verses the amount of current flowing through the conductor for current sense configuration 10 of FIG. 1A. Line plot 264 illustrates the relationship between the magnetic flux density incident on a magnetic field sensor verses the amount of current flowing through the conductor for current sensing device 50 of FIG. 2A.

As shown in FIG. 11, the magnetic flux density incident on the magnetic field sensor 56 of FIG. 2A is substantially less than the magnetic flux density incident on the Hall effect sensor 20 of FIG. 1A. The reduced magnetic flux density may allow a magnetic field sensor to be used that has a higher level of magnetic field sensitivity than that of the Hall effect sensor 20 in FIG. 1A without causing the magnetic field sensor to saturate. Using a magnetic field sensor with a higher level of magnetic sensitivity may reduce the gain required by a downstream amplifier, which may in turn increase the available bandwidth at which the amplifier can operate. Thus, a magnetic core having air gap interfaces designed in accordance with this disclosure may provide an open loop current sensor with increased bandwidth capabilities relative to the current sensor configuration of FIG. 1A.

Figure 12:
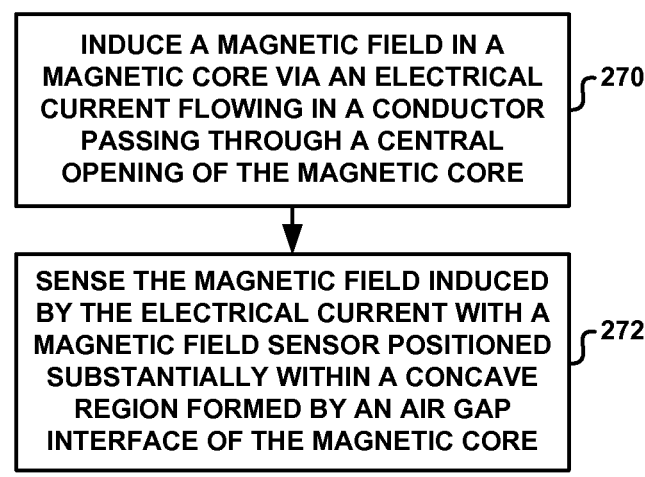
FIG. 12 is a flow chart illustrating an example technique for sensing the current in a conductor according to this disclosure.

FIG. 12 is a flow chart illustrating an example technique for sensing the current in a conductor. The technique illustrated in FIG. 12 is described below with respect to current sensing device 50 of FIG. 2A for exemplary purposes. It is understood, however, that the technique of FIG. 12 may be used in any of the current sensing devices described in this disclosure.

An electrical current flowing in a conductor 54 that passes through a central opening 60 of magnetic core 52 within current sensing device 50 induces a magnetic field in magnetic core 52 (270). A magnetic field sensor 56 positioned substantially within cavity 72 formed by air gap interface 66 of magnetic core 52 senses the magnetic field induced by the electrical current (272).

Figure 13:
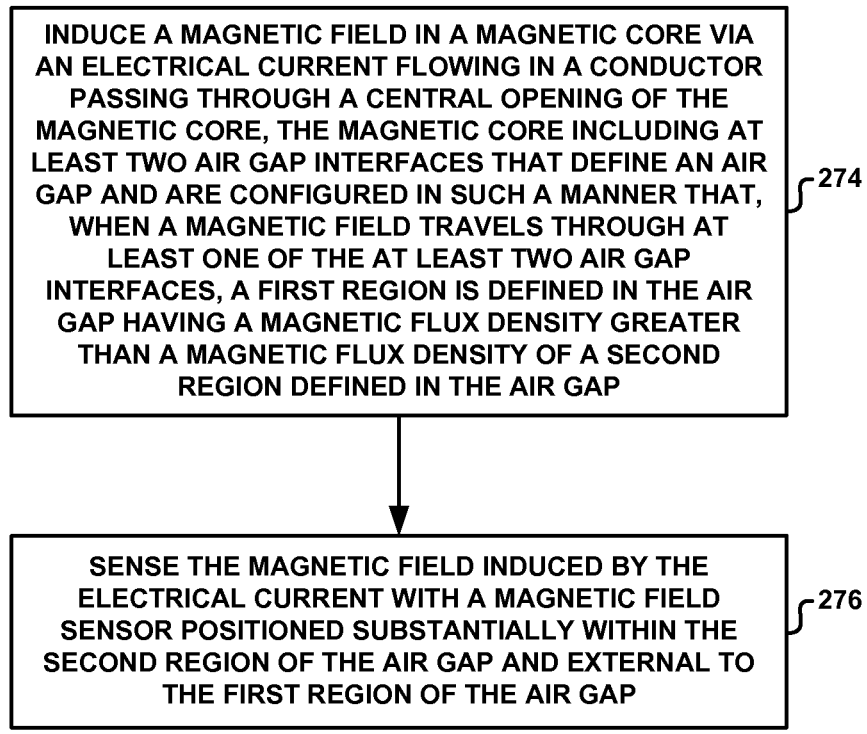
FIG. 13 is a flow chart illustrating another example technique for sensing the current in a conductor according to this disclosure.

FIG. 13 is a flow chart illustrating an example technique for sensing the current in a conductor. The technique illustrated in FIG. 13 is described below with respect to current sensing device 50 of FIG. 2A for exemplary purposes. It is understood, however, that the technique of FIG. 13 may be used in any of the current sensing devices described in this disclosure.

An electrical current flowing in a conductor 54 that passes through a central opening 60 of magnetic core 52 within current sensing device 50 induces a magnetic field in magnetic core 52 (274). The magnetic core includes at least two air gap interfaces that define an air gap and are configured in such a manner that, when a magnetic field travels through at least one of the at least two air gap interfaces, a first region is defined in the air gap having a magnetic flux density greater than a magnetic flux density of a second region defined in the air gap. A magnetic field sensor 56 positioned substantially within the second region of air gap 70 and external to the first region of air gap 70 senses the magnetic field induced by the electrical current (276).

Figure 14:
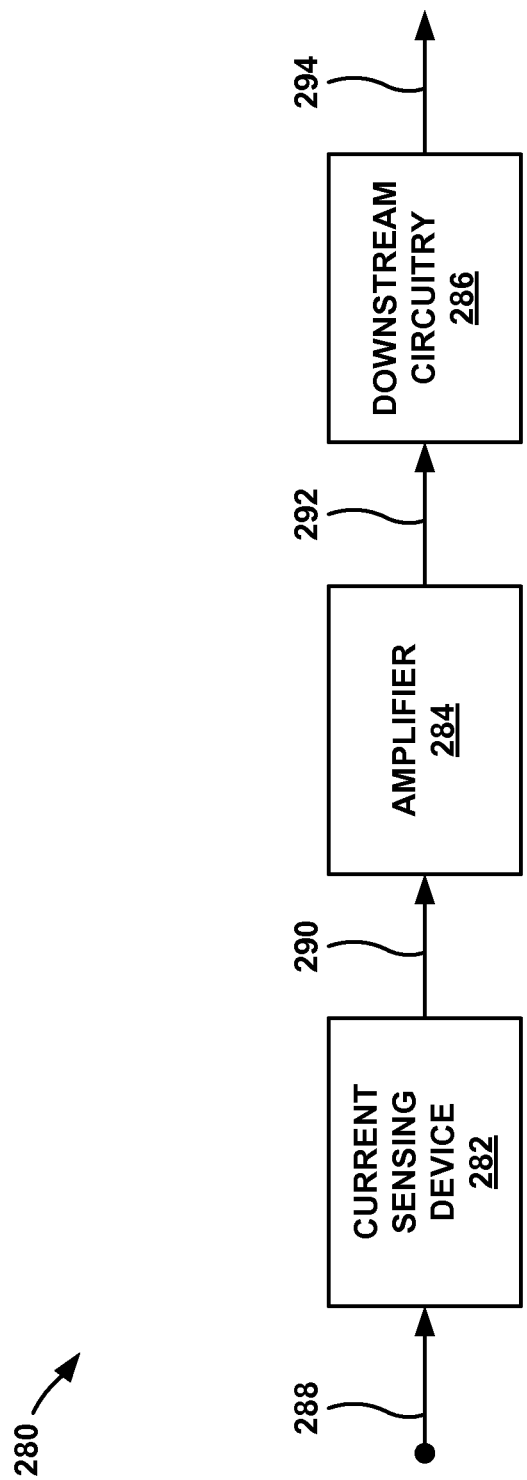
FIG. 14 is a block diagram illustrating an example current sensing system according to this disclosure.

FIG. 14 is a block diagram illustrating an example current sensing system 280 according to this disclosure. Current sensing system 280 is configured to measure a current flowing through a conductor, and to produce an output signal based on the measured current. Current sensing system 280 includes a current sensing device 282, an amplifier 284 and downstream circuitry 286.

Current sensing device 282 is configured to sense an input current signal 288 via a conductor, and to produce an output signal 290 indicative of the amount or magnitude of electrical current flowing through the conductor. In some examples, output signal 290 may also be indicative of the direction of current flow through the conductor. Output signal 290 is coupled to the input of amplifier 284.

Current sensing device 282 may, in some examples, be implemented according to the techniques in this disclosure. For example, current sensing device 282 may correspond to the current sensing devices shown in FIGS. 2-8 of this disclosure. In some examples, current sensing device 282 may have an open loop configuration.

Amplifier 284 is configured to receive output signal 290 and produce an amplified signal 292 corresponding to output signal 290. In some examples, amplifier 284 may have a substantially constant gain bandwidth product (GBW). In further examples, amplifier 284 may be configured to generate amplified signal 292 such that amplified signal 292 fluctuates within a valid input range for downstream circuitry 286.

Downstream circuitry 286 is configured to perform post-processing upon amplified signal 292 and to produce a processed output signal 294 based on the sensed level of current. In some examples downstream circuitry 286 may generate processed output signal 294 such that the signal is indicative of a magnitude of the sensed current. In further examples, downstream circuitry 286 may generate processed output signal 294 such that the signal indicates whether the level of current flowing through the conductor is greater than or less than a particular threshold. In additional examples, downstream circuitry 286 may perform analog-to-digital conversion on amplified signal 292 to produce a digital processed output signal 294.

Downstream circuitry 286 may, in some examples, be implemented as a control circuit for controlling another device based on the sensed current 288. In further examples, downstream circuitry 286 may be implemented as a monitoring circuit for monitoring a signal represented by the input current 288.

In some examples, current sensing system 280 may have a current sensing device 282 that includes a TMR magnetic field sensor. In such examples, current sensing system 280 may, in some examples, have no amplifier 284 because of the relatively high magnetic field sensitivity of the TMR sensor.

In additional examples, current sensing system 280 may have a current sensing device 282 that includes a GMR magnetic field sensor and an amplifier 284 having a relatively low gain. In such examples, the GMR magnetic field sensor may have a relatively moderate level of magnetic field sensitivity such that a relatively low gain amplifier may only be needed to achieve a proper level amplified signal 292.

In further examples, current sensing system 280 may have a current sensing device 282 that includes an AMR magnetic field sensor and an amplifier 284 having a relatively high gain. In such examples, the AMR magnetic field sensor may have a relatively low level of magnetic field sensitivity such that a relatively high gain amplifier may be needed to achieve a proper level amplified signal 292.

The techniques in this disclosure may improve the gain of current sensing device 282 within current sensing system 280. For example, a magnetic core having an air gap designed in accordance with this disclosure may allow for the use of a relatively high-sensitivity magnetic field sensor (e.g., a magnetoresistive magnetic field sensor) in the air gap of the magnetic core. The relatively high-sensitivity magnetic field sensor may reduce the amount of and/or eliminate the need for amplification by amplifier 284 relative to conventional current sensing systems that use open loop current sensing devices 282 having Hall effect magnetic field sensors. If amplifier 284 is used in current sensing system 280, the reduced gain allows for an increase in the bandwidth of amplifier 284. If amplifier 284 is removed, then the bandwidth of current sensing system 280 is no longer limited by gain-bandwidth product of amplifier 284. In any case, the bandwidth of a current sensing system 280 designed in accordance with the techniques of this disclosure may be increased relative to the bandwidth achievable in conventional current sensing systems that use open loop current sensing devices 282 having Hall effect magnetic field sensors.

Various embodiments of the invention have been described. These and other embodiments are within the scope of the following claims.

The invention claimed is:

1. A current sensing device, comprising:
a magnetic core comprising an air gap interface comprising a first portion, a second portion, a third portion, a fourth portion, and a fifth portion, an end of the first portion being connected to a first end of the second portion, a second end of the second portion being connected to a first end of the third portion, a second end of the third portion being connected to a first end of the fourth portion, a second end of the fourth portion being connected to an end of the fifth portion, a cavity within the magnetic core being formed by the second portion, the third portion, and the fourth portion; and
a magnetic field sensor positioned substantially within the cavity between the second portion and the fourth portion of the air gap interface, the magnetic field sensor being configured to sense a magnetic field induced by an electrical current that is conducted through a conductor passing through a central opening of the magnetic core.

2. The current sensing device of claim 1,
wherein the current sensing device has an open loop configuration, and
wherein the magnetic field sensor comprises a magnetoresistive sensor.

3. The current sensing device of claim 1, wherein an air gap formed by the air gap interface and at least one other air gap interface has a plus-shaped cross-sectional area.

4. The current sensing device of claim 1, wherein the current sensing device has an open loop configuration.

5. The current sensing device of claim 1, wherein a magnetic flux density of magnetic flux incident upon the magnetic field sensor is substantially within an input operating range of the magnetic field sensor.

6. The current sensing device of claim 1,
wherein the air gap interface is a first air gap interface,
wherein the magnetic core comprises a second air gap interface, wherein a first distance between the third portion of the first air gap interface and the second air gap interface is greater than a second distance between the first portion of the first air gap interface and the second air gap interface, and wherein the first distance between the third portion of the first air gap interface and the second air gap interface is greater than a third distance between the fifth portion of the first air gap interface and the second air gap interface.

7. The current sensing device of claim 6, wherein the first distance and the second distance are selected based on a predetermined level of electrical current to be sensed by the current sensing device.

8. The current sensing device of claim 6, wherein the second air gap interface comprises a first portion, a second portion, a third portion, a fourth portion, and a fifth portion, an end of the first portion being connected to a first end of the second portion, a second end of the second portion being connected to a first end of the third portion, a second end of the third portion being connected to a first end of the fourth portion, a second end of the fourth portion being connected to an end of the fifth portion, a cavity within the magnetic core being formed by the second portion, the third portion, and the fourth portion, wherein a first region of the air gap is defined between a first portion of the first air gap interface and a first portion of the second air gap interface, wherein a second region of the air gap is defined between a third portion of the first air gap interface and a third portion of the second air gap interface, wherein a third region of the air gap is defined between a fifth portion of the first air gap interface and a fifth portion of the second air gap interface, wherein a distance between the third portion of the first air gap interface and the third portion of the second air gap interface is less than the distance between the second portion of the first air gap interface and the second portion of the second air gap interface.

9. The current sensing device of claim 8, wherein the first portion of the first air gap interface and the first portion of the second air gap interface are substantially parallel to one another, wherein the second portion of the first air gap interface and the second portion of the second air gap interface are substantially parallel to one another, and wherein the third portion of the first air gap interface and the third portion of the second air gap interface are substantially parallel to one another.

10. The current sensing device of claim 8, wherein a width of the first region of the air gap and a width of the third region of the air gap interface are approximately equal.

11. The current sensing device of claim 8, wherein the first region of the air gap is adjacent the central opening of the magnetic core, and wherein a width of the first region of the air gap is shorter than a width of the third region of the air gap.

12. The current sensing device of claim 8, wherein a width of the first region of the air gap and a width of the third region of the air gap are selected based on a predetermined level of external magnetic field noise to which the current sensing device may be subject during operation.

13. The current sensing device of claim 1, wherein the magnetic field sensor comprises a magnetoresistive sensor.

14. The current sensing device of claim 13, wherein the magnetoresistive sensor comprises at least one of an anisotropic magnetoresistive (AMR) sensor, a giant magnetoresistive (GMR) sensor, and a tunneling magnetoresistive (TMR) sensor.

15. A method comprising:

sensing a magnetic field induced by an electrical current that is conducted through a conductor passing through a central opening of a magnetic core with a magnetic field sensor positioned substantially within a cavity formed by an air gap interface of the magnetic core, wherein the magnetic core comprises an air gap interface comprising a first portion, a second portion, a third portion, a fourth portion, and a fifth portion, an end of the first portion being connected to a first end of the second portion, a second end of the second portion being connected to a first end of the third portion, a second end of the third portion being connected to a first end of the fourth portion, a second end of the fourth portion being connected to an end of the fifth portion, the cavity within the magnetic core being formed by the second portion, the third portion, and the fourth portion.

16. The method of claim 15, wherein an air gap formed by the air gap interface and at least one other air gap interface has a plus-shaped cross-sectional area.

17. The method of claim 15, wherein the magnetic core, the conductor, and the magnetic field sensor form a current sensing device having an open loop configuration.

18. The method of claim 15, wherein the magnetic field sensor comprises at least one of a magnetoresistive sensor, an anisotropic magnetoresistive (AMR) sensor, a giant magnetoresistive (GMR) sensor, and a tunneling magnetoresistive (TMR) sensor.

* * * * *